United States Patent [19]
Furtek et al.

[11] Patent Number: 5,245,227
[45] Date of Patent: Sep. 14, 1993

[54] VERSATILE PROGRAMMABLE LOGIC CELL FOR USE IN CONFIGURABLE LOGIC ARRAYS

[75] Inventors: Frederick C. Furtek, Menlo Park; Rafael C. Camarota, San Jose, both of Calif.

[73] Assignee: Atmel Corporation, San Jose, Calif.

[21] Appl. No.: 752,419

[22] Filed: Aug. 30, 1991

Related U.S. Application Data

[63] Continuation-in-part of Ser. No. 608,415, Nov. 2, 1990, Pat. No. 5,144,166.

[51] Int. Cl.[5] ........................................ H03K 19/177
[52] U.S. Cl. ..................................... 307/465; 307/243; 307/272.2
[58] Field of Search ................. 307/443, 243, 465–469, 307/272.2

[56] References Cited

U.S. PATENT DOCUMENTS

| | | | |
|---|---|---|---|
| 3,713,073 | 5/1973 | Moylan | 307/465 X |
| 4,642,487 | 2/1987 | Canten | 307/465 |
| 4,786,904 | 11/1988 | Graham, III et al. | 307/465 X |
| 5,055,685 | 10/1991 | Galbraith et al. | 307/243 X |
| 5,068,549 | 11/1991 | Iwasaki | 307/465.1 |
| 5,122,685 | 6/1992 | Chan et al. | 307/465.1 |

Primary Examiner—David R. Hudspeth
Attorney, Agent, or Firm—Pennie & Edmonds

[57] ABSTRACT

An improved programmable logic cell for use in a programmable logic array comprising cells which are arranged in a two-dimensional matrix of rows and columns and are interconnected by a two-dimensional array of direct connections between a cell and its four nearest neighbors, one to its left (or to the West), and one to its right (or to the East), one above it (or to the North) and one below it (or to the South). Each cell receives input(s) from each of its nearest neighbors and additional input(s) (from a bus, pin, or neighbor) and may be programmed to generate a variety of logical functions at its outputs which connect to the cell's four nearest neighbors. The core of the improved logic cell comprises two upstream gates, the outputs of which feed two downstream gates, one of which is an exclusive-OR gate which feeds a downstream register. Additional programmable connections and other logic augment the cell core to produce cell embodiments which can be configured to efficiently implement various logical functions. Among the functions which may be implemented by the improved cell are a number of two-level combinational functions (such as multiplexing) and sequential functions (such as counting and shifting). A variety of cell embodiments based on the improved cell core are illustrated.

35 Claims, 21 Drawing Sheets

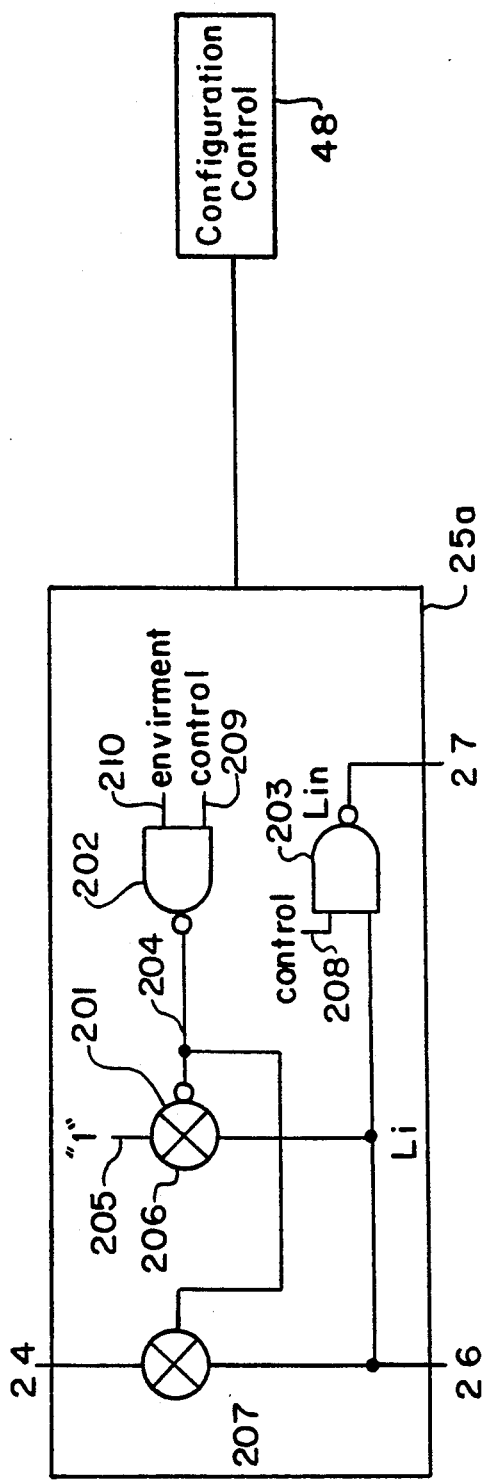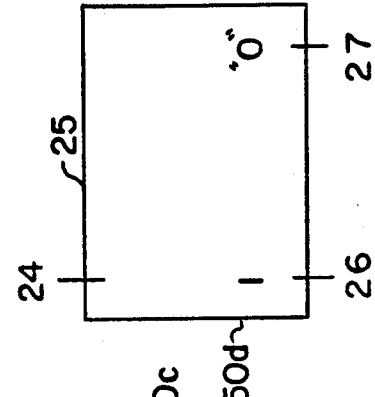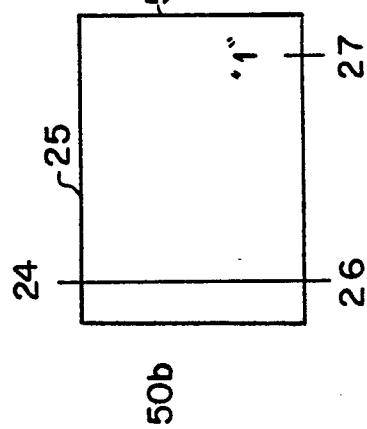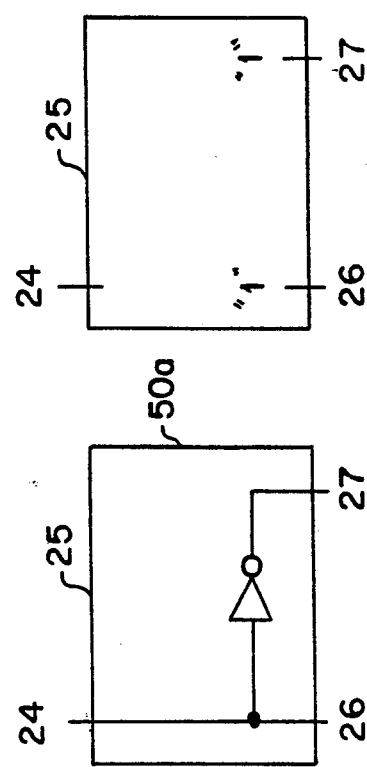

VERSATILE PROGRAMMABLE LOGIC CELL FOR USE IN CONFIGURABLE LOGIC ARRAYS

CROSS REFERENCE TO RELATED PATENTS AND APPLICATIONS

The present application is a continuation-in-part of U.S. Pat. No. 5,144,166, issued Sep. 1, 1992, which is incorporated herein by reference. U.S. Pat. No. 5,019,736 for "Programmable Logic Cell and Array" is related and incorporated herein by reference. The present application is also related to an application entitled "Configurable Logic Array" by inventors Garverick, Sutherland, Popli, Alturi, Smith, Pickett, Hawley, Chen, Moni, Ting, Camarota, Day and Furtek, filed Aug. 29, 1991.

FIELD OF THE INVENTION

This invention relates to the field of digital logic circuits and, more particularly, to programmable and reprogrammable logic devices.

BACKGROUND OF THE INVENTION

The '415 application describes an array of programmable logic cells, wherein each logic cell is structurally identical. The logic cells of the array are arranged in a two-dimensional matrix such that each cell has four nearest-neighbor cells, one to its left (or to the West), one to its right (or to the East), one above it (or to the North) and one below it (or to the South). For each of the four directions (North, South, East and West), the cell has two inputs and two outputs which are connected to the two outputs and two inputs of the nearest-neighbor cell in that direction. Thus, signal flow is possible in both directions in both dimensions.

FIG. 1 of the '415 application depicts a programmable logic array 10 comprising cells 22 and a bus network 12. Cells 22 are arranged in a two-dimensional matrix of rows and columns and are interconnected by bus network 12 by connections not shown in FIG. 1. The cells are also interconnected by a two-dimensional array of direct connections between a cell and its four nearest-neighbors, (i.e., the four cells immediately adjacent to the North, East, South and West). The bus network 12, which comprises repeaters 24 and vertical and horizontal buses 25, 26, 27, provides for the transfer of data within the array 10 without requiring individual cells 22 to act as logical wires. Although implicitly present, discussion of bus structure is hereinafter omitted since it is not relevant to the present invention.

One object of the present invention is to provide an improved logic cell with greatly enhanced flexibility yet relatively modest increase in size.

Another object is to provide an improved array similar to that of the '415 application but including an improved logic cell.

In the array of the '415 application, depending on the logical function implemented by a given cell, the ability of that cell to also implement "logical wires" between its unused inputs/outputs is sometimes restricted. This can result in inefficient utilization of the cells in the array of the '415 application because certain cells may be required merely to implement the logical wire functions.

Yet another object of the present invention is to provide an improved array, including an improved cell, in which the logical connections between a cell's unused inputs and outputs are not blocked.

SUMMARY OF THE INVENTION

The present invention provides an improved logic cell for use in a logic cell array such as that of the '415 application. A preferred embodiment of the improved logic cell of the present invention comprises two levels of combinational logic and a register disposed downstream from the two levels of combinational logic. While the improved cell of the present invention is not significantly larger, in terms of VLSI area, than that employed in the array of the '415 application, its improved design facilitates implementation of significantly denser logic in the array. For example, implementing a multiplexer, which would require six cells using the logic cells of the '415 application, requires only one cell in the present invention. Similar savings are achieved for other functional blocks, including loadable shift registers, counters, and others. Moreover, since the speed of the logic implemented on the array is largely determined by the delay associated with the connections between cells in the array, the arrays of the present invention, which implement a much larger fraction of the necessary logical connections within a single cell, can achieve higher performance than those described in the '415 application.

The present invention also provides an improved array, including an improved logic cell, in which the unused inputs and outputs of a cell can be logically connected through a multiplexing means disposed within the cell. For example, with such an array in which each cell has four inputs and four outputs, a single cell could be employed both as a half adder (using two inputs and two outputs), and as a routing element to provide connections between the two unused inputs and outputs.

BRIEF DESCRIPTION OF THE DRAWINGS

These and other objects, features and advantages of the invention may be better understood by referring to the following detailed description, which should be read in conjunction with the accompanying drawings in which:

FIGS. 4A–4E show an exemplary implementation and a number of possible configuration states of the configurable-interconnect element 25 of FIGS. 2 and 3;

DETAILED DESCRIPTION OF THE DRAWINGS

Figure 1:
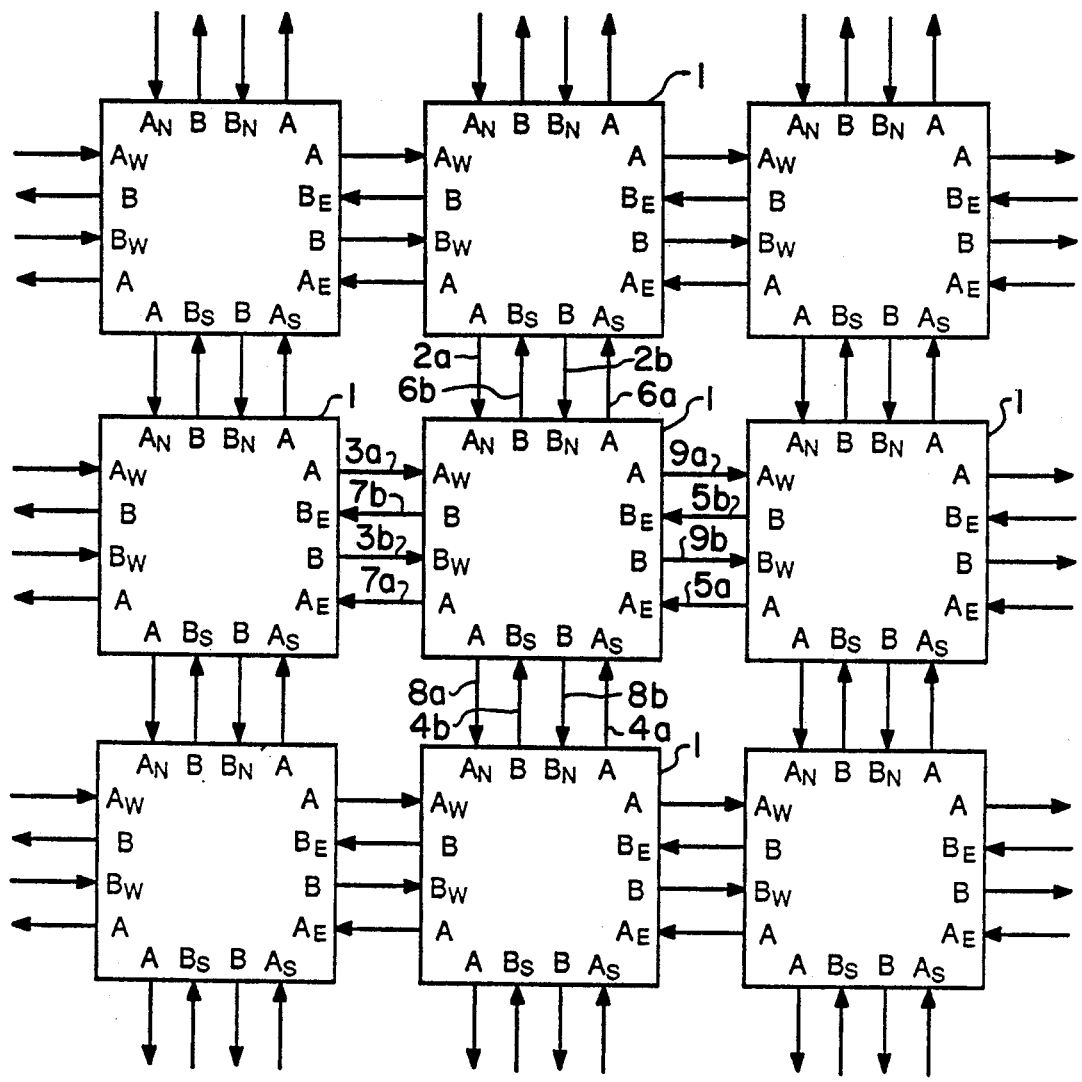
FIG. 1 is a diagrammatic illustration of an exemplary portion of an array of cells, with bussing omitted, in accordance with the '415 application.

FIG. 1 depicts the direct interconnections within an exemplary portion of an array of cells 1 such as that described in the '415 application. As is apparent, the cells are arranged in a two-dimensional matrix with each cell having four nearest-neighbors, one to its left (or to the West), one to its right (or to the East), one above it (or to the North) and one below it (or to the South). Each cell 1 is identical with respect to its direct connections to its four nearest-neighbors. To each such neighbor, the cell provides two outputs and from each such neighbor the cell receives two inputs. Thus, each cell 1 has eight inputs 2a, 2b, 3a, 3b, 4a, 4b, 5a, 5b and eight outputs 6a, 6b, 7a, 7b, 8a, 8b, 9a, 9b. Cell inputs and outputs are divided into two categories "A" and "B", whereby each cell has an A input, an A output, a B input and a B output connected to each of its four nearest-neighbors. Between adjacent cells, an A input is always connected to an A output and a B input is always connected to a B output.

Figure 16:
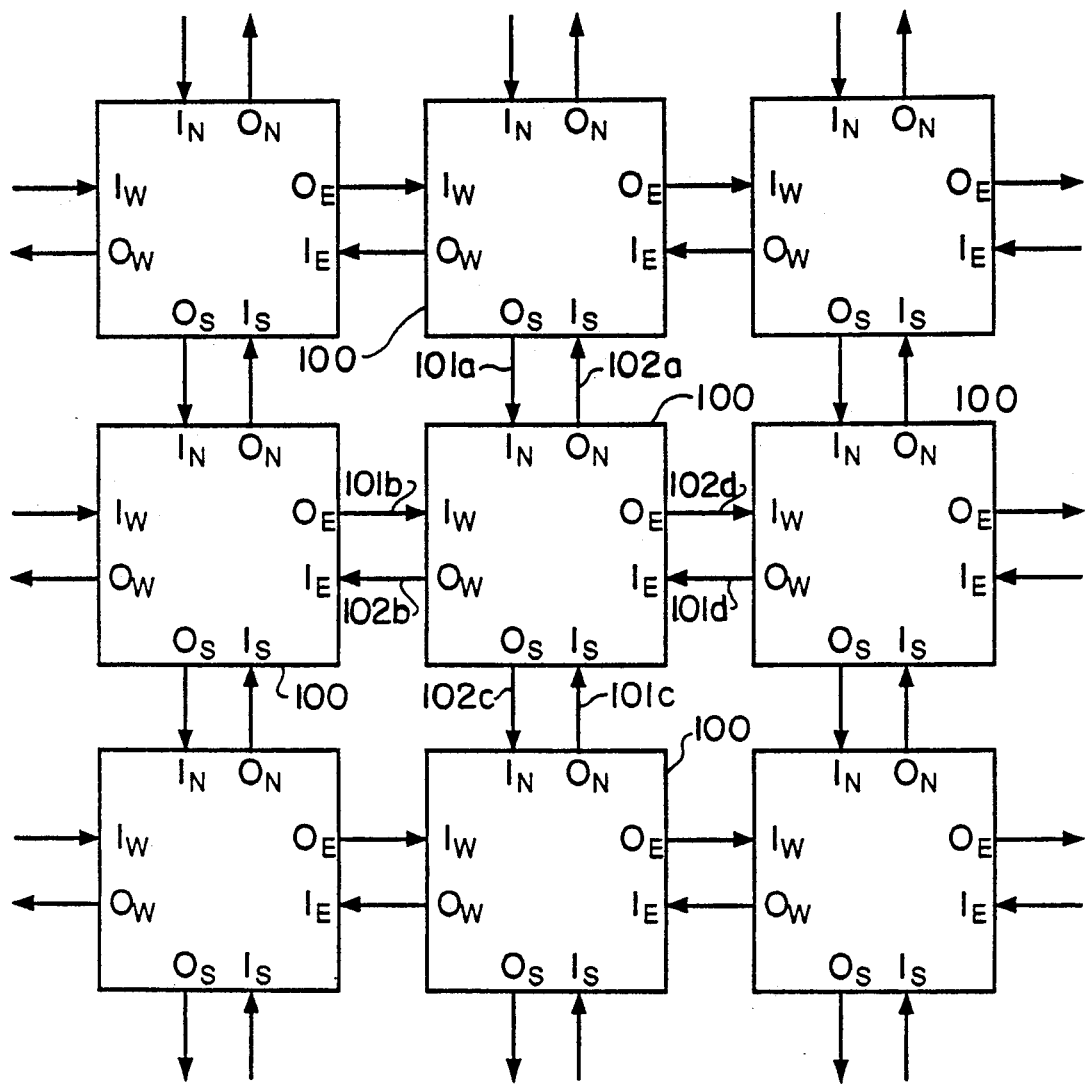
FIG. 16 is a diagrammatic illustration of an exemplary portion of an array in which each cell has four inputs and four outputs, one input and one output for each of its four nearest-neighbor cells.
Figure 17:
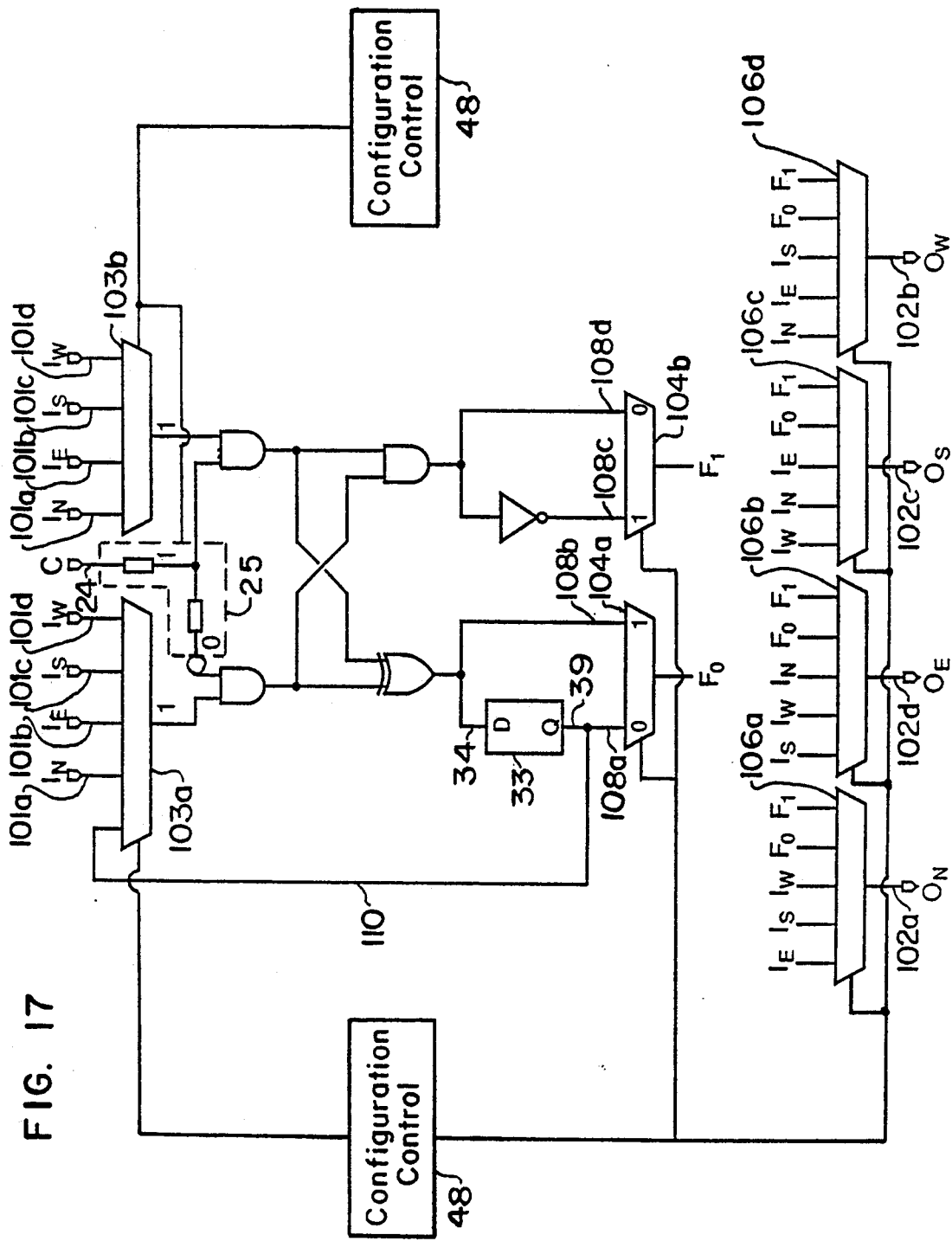
FIG. 17 is a logic diagram showing one embodiment of the improved logic cell in accordance with the present invention for use in an array as depicted in FIG. 16.
Figure 18:
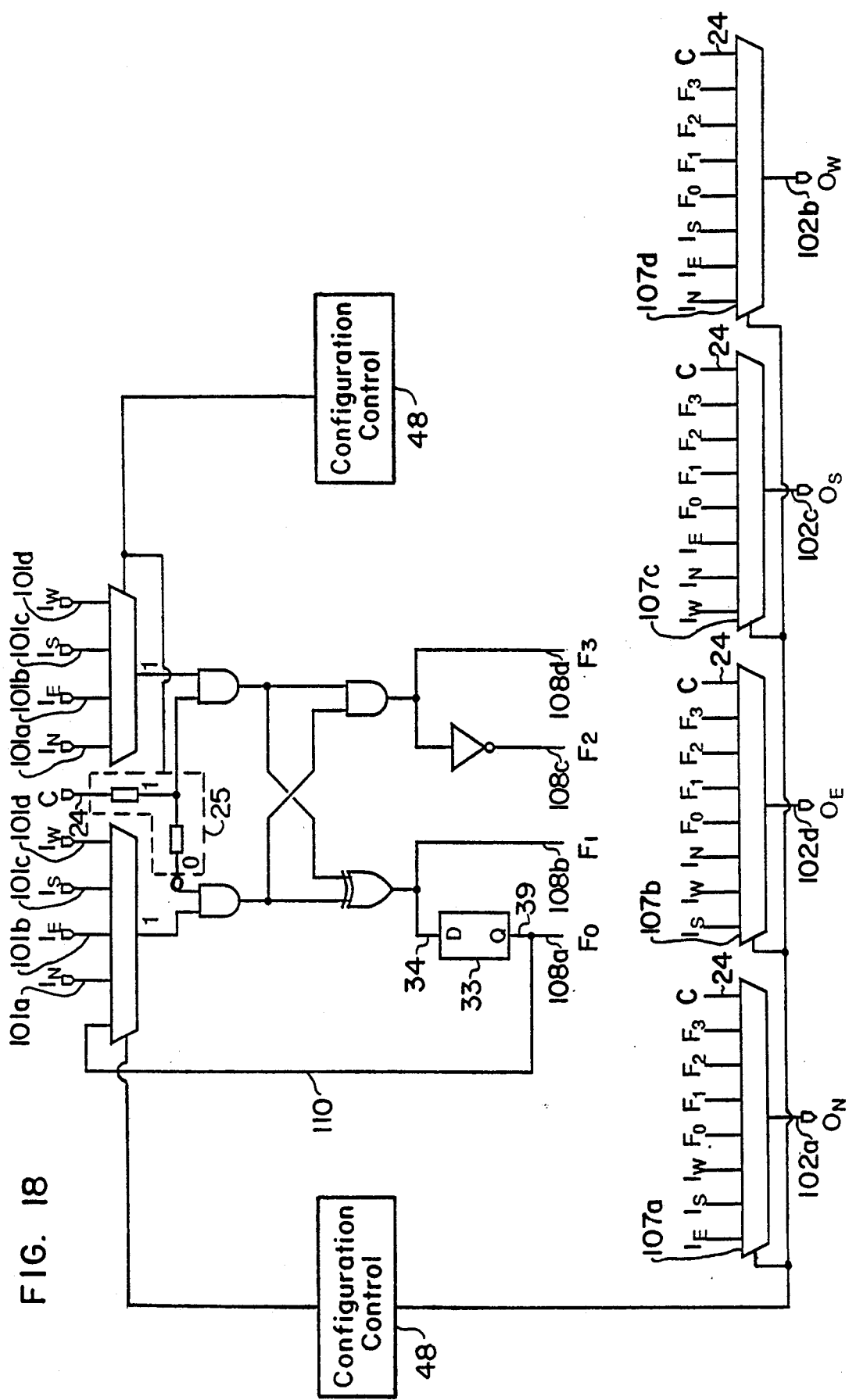
FIG. 18 is a logic diagram showing another embodiment of the improved logic cell in accordance with the present invention for use in an array as depicted in FIG. 16.

Several embodiments of an eight-input, eight-output cell of the present invention which is suitable for use in array such as that of FIG. 1 are shown in FIGS. 11-14. The invention may also be practiced using cells with different numbers of inputs and outputs. Two possible embodiments of a four-input, four-output cell suitable for use in an array such as that of FIG. 16 are depicted in FIGS. 17-18. Each of these six embodiments shown in FIGS. 11-14 and 17-18 has the same basic structure or cell core, a preferred embodiment of which is depicted in the logic diagram of FIG. 2. As shown, this cell core has two levels of logic, the first of which comprises two combinational gates, illustratively AND gates 21 and 23, and the second of which comprises two combinational gates, illustratively EXCLUSIVE OR (XOR) gate 28 and AND gate 41, a configurable-interconnect element 25 which provides input to the first level of logic, a register 33 downstream of XOR gate 28, and a configuration control 48.

The cell core has first, second and third logical inputs 20, 22, 24. Inputs 20, 22, and 24 may originate from the nearest-neighbor cells, from a bus network (like that shown in the '415 application or in the previously referenced related application "Configurable Logic Array"), from some other source or from some combination of these.

In the cell core, the first logical input 20 enters upstream AND gate 21, and the second logical input 22 enters upstream AND gate 23. Input 24 is applied to configurable-interconnect element 25 which generates a first output 26 and a second output 27. Configurable-interconnect element 25 has at least two configuration states which are controlled by value(s) supplied by configuration control 48.

Configuration control 48 may be supplied via a variety of means, including but not limited to a control-store memory associated either with the cells or the array, a combinational function of other cells' configuration controls, or electronically fusible, electrically, optically or magnetically programmable circuit elements. For generality, only the configuration-control lines 48 are shown in the drawings of the logic cell.

FIG. 4A shows an exemplary implementation 25a of the configurable-interconnect element 25. Configurable-interconnect element 25a comprises pass gates 206 and 207, and NAND gates 202 and 203. Configurable-interconnect element 25a is configured by the values of three inputs: configuration-control inputs 208 and 209, and an environment input 210. Configuration-control inputs 208 and 209 are derived from the previously discussed configuration control 48. Environment input 210 is derived as a combinational function of various configuration-control signals from the cell and from neighboring cells.

Environment signal 210 and configuration-control signal 209 are combined by NAND gate 202 to produce signal 204. Signal 204 controls pass gates 206 and 207. Since the enable polarity of pass gates 206 and 207 is opposite, only one of these pass gates is active at any time. When pass gate 207 is active, configurable-interconnect element input 24 drives configurable-interconnect element output 26 and the input of NAND gate 203. Configurable-interconnect element output 27 is generated by NAND gate 203, which is gated by configuration-control signal 208. When pass gate 206 is active, a logical "1" is directed to output 26 and is gated through NAND gate 203 to output 27.

Four states of the exemplary configurable-interconnect element 25a are shown as 50a-d. In state 50a illustrated in FIG. 4B, the configurable-interconnect element input 24 is logically connected to the first configurable-interconnect element output 26 and is connected in logically inverted form to the second configurable-interconnect element output 27. These outputs are provided when pass gate 207 is active and a high signal is provided on the control input to NAND gate 203. In state 50b, illustrated in FIG. 4C, the configurable-interconnect element 25 simply provides constant logical values ("1") to both configurable-interconnect element outputs 26 and 27, regardless of the value of configurable-interconnect element input 24. These outputs are provided when pass gate 206 is active and a low signal is provided on control input 208 to NAND gate 203. In state 50c, as shown in FIG. 4D, input 24 is connected to output 26 by making pass gate 207 active and a "1" signal is provided at output 27 by applying a low signal to control input 208 of NAND gate 203. In state 50d as shown in FIG. 4E, a "1" signal is provided at output 26 when pass gate 206 is active and a "0" signal is provided at output 27 when a high signal is also provided on control input 208 of NAND gate 203. There are many ways to construct a configurable-interconnect element 25, some of which may have other useful states.

Referring again to FIG. 2, it is evident that when the configurable-interconnect element 25 is configured in state 50b, the effect is to cause the upstream AND gates 21 and 23 to act as pass throughs between the first logical input 20 and output 29, and the second logical input 22 and output 30, respectively. Also in FIG. 2, inputs 31 and 32 of downstream EXCLUSIVE-OR (XOR) gate 28 are connected to the outputs 29 and 30 of upstream AND gates 21 and 23, respectively. Register 33 is disposed downstream with its input 34 connected to output 35 of downstream XOR gate 28. Advantageously, the cell core may also include a multiplexer 36 to select between two possible inputs, 37 and 38, the first of which is connected to a Q output 39 of register 33 and the second of which is connected to output 35 of the downstream XOR gate 28. A first logical output 40 of the cell core is provided by multiplexer 36 to neighboring cells, a bus network, array I/Os, or other destinations, or some combination of these.

The cell core also includes downstream AND gate 41. Like the downstream XOR gate 28, downstream AND gate 41 derives its two inputs 42 and 43 from the outputs 29 and 30 of the upstream AND gates 21 and 23. An output 44 of the downstream AND gate 41 is provided to a second logical output 45 of the cell core which, like the first logical output 40, may connect to neighboring cells, a bus network, array I/Os, other destinations, or some combination of these.

The design of this cell core has been carefully streamlined to be as compact and simple as possible, yet still include the logical flexibility to allow efficient implementation of a wide variety of important functions. While functionally similar cells exist in the art, such cells have generally employed large programmable AND-OR array elements or similar PLD devices to implement the functions performed by the four combinational gates 21, 23, 28, and 41 in the present cell core. The inclusion of such programmable AND-OR array elements in a cell has two major drawbacks. First, it requires a significant increase in the chip area needed to realize the cell, thus allowing fewer cells to be placed on a single chip. Second, the programmable AND-OR array element significantly diminishes the performance of a cell because of the large capacitances at its internal nodes. The cell core of the present invention realizes the necessary flexibility, as will be later illustrated, without such sacrifices in compactness or speed.

Figure 2:
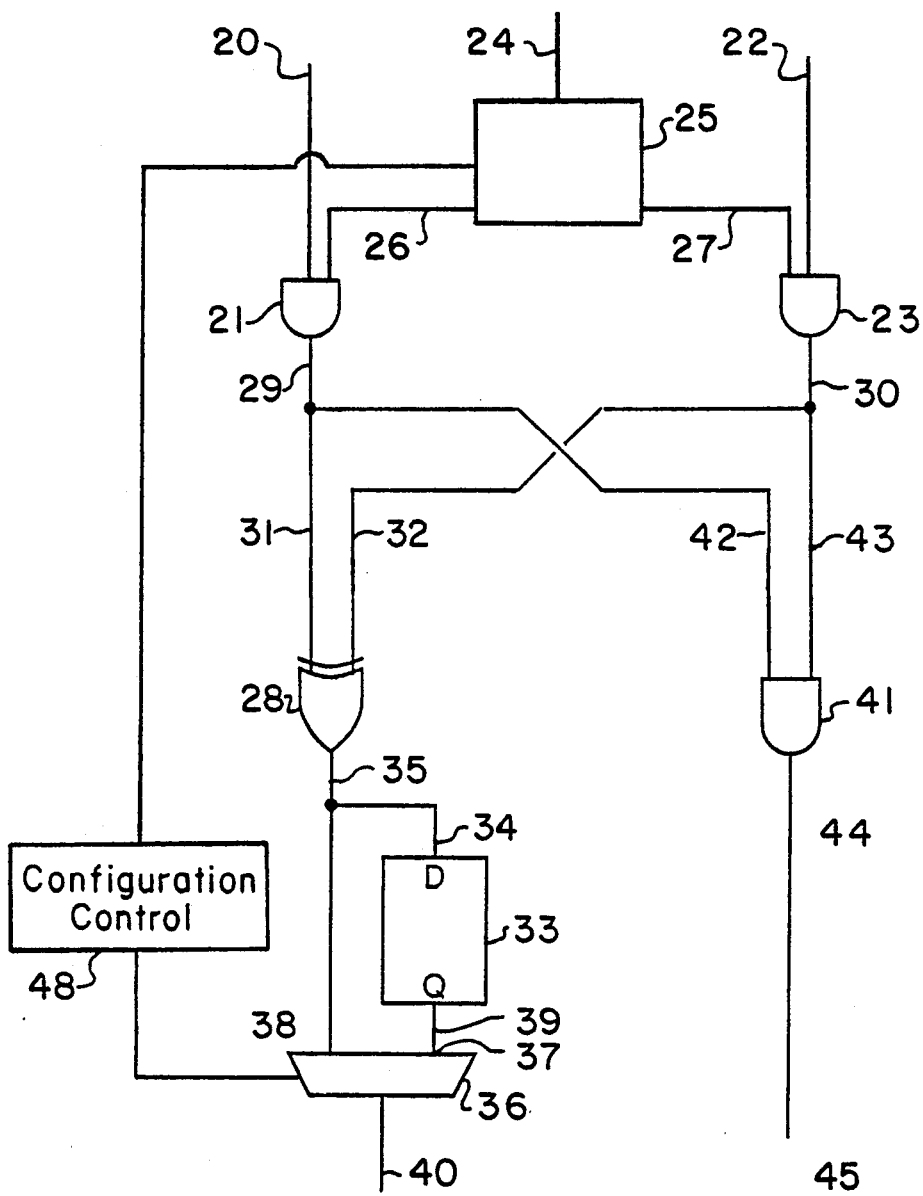
FIG. 2 is a logic diagram illustrating a preferred cell core containing the essential features of the improved logic cell in accordance with the present invention.
Figure 3:
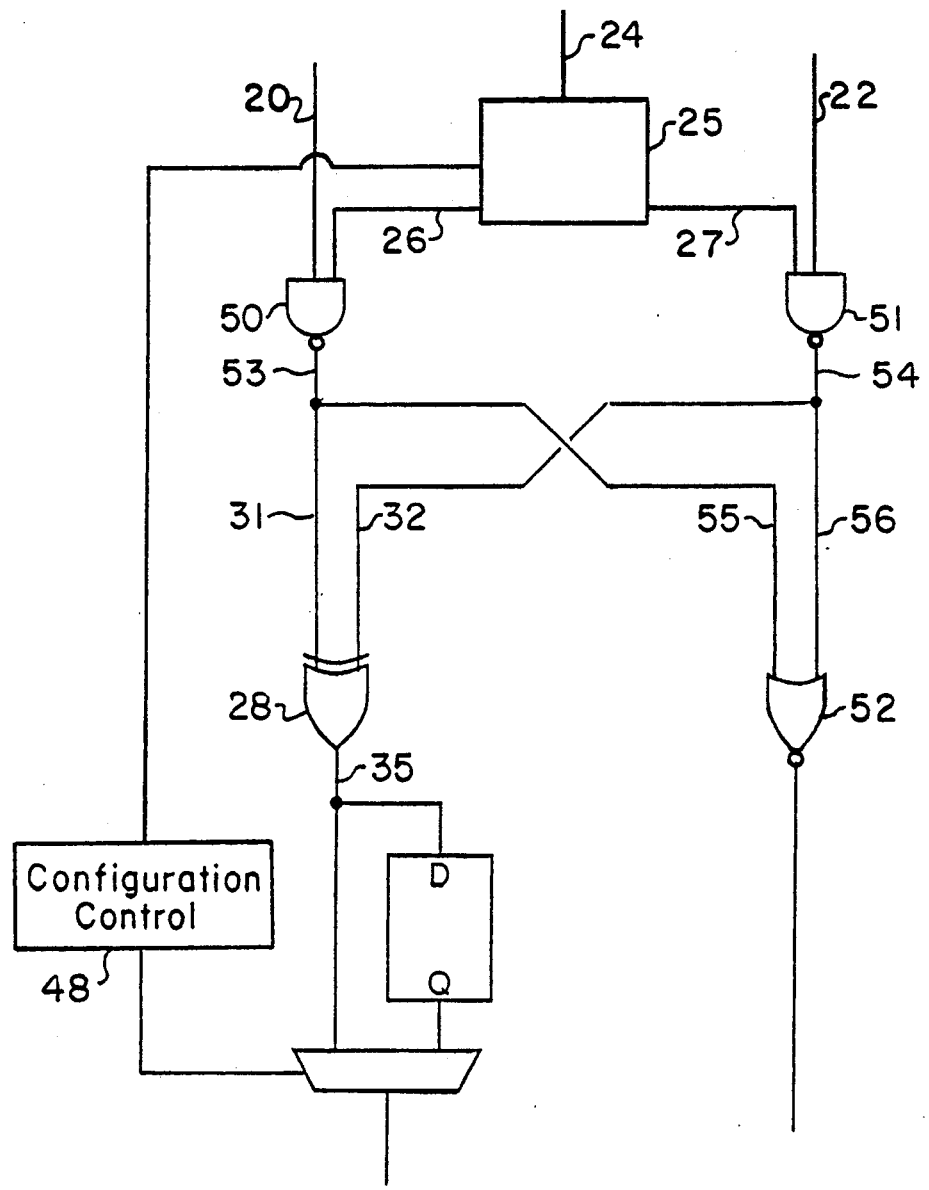
FIG. 3 is a logic diagram depicting an alternative logic implementation of the preferred cell core in accordance with the present invention.

FIG. 3 depicts an alternative cell core design logically equivalent to that of FIG. 2. The difference between this cell core and that of FIG. 2 is the replacement of the upstream AND gates 21 and 23 with NAND gates 50 and 51, and the replacement of the downstream AND gate 41 with NOR gate 52. These changes have no effect on the logical functioning of the cell core. The fact that the signals on inputs 31 and 32 to the downstream XOR gate 28 are inverted in FIG. 3 (with respect to the signals on inputs 31 and 32 of FIG. 2) has no effect on the output 35 of XOR gate 28. Also, by propagating the inverting "bubbles" from the outputs 53 and 54 of the upstream NAND gates 50 and 51 to the inputs 55 and 56 of the downstream NOR gate 52, the logic equivalence of NOR gate 52 and AND gate 41 becomes evident. In reality, the structure shown in FIG. 3 more closely resembles an actual integrated circuit implementation. However, since the logical function of the cell core in FIG. 2 is more intuitive, the logic cell embodiments illustrated in FIGS. 11-14 and 17-18 are derived from the cell core of FIG. 2.

Figure 5:
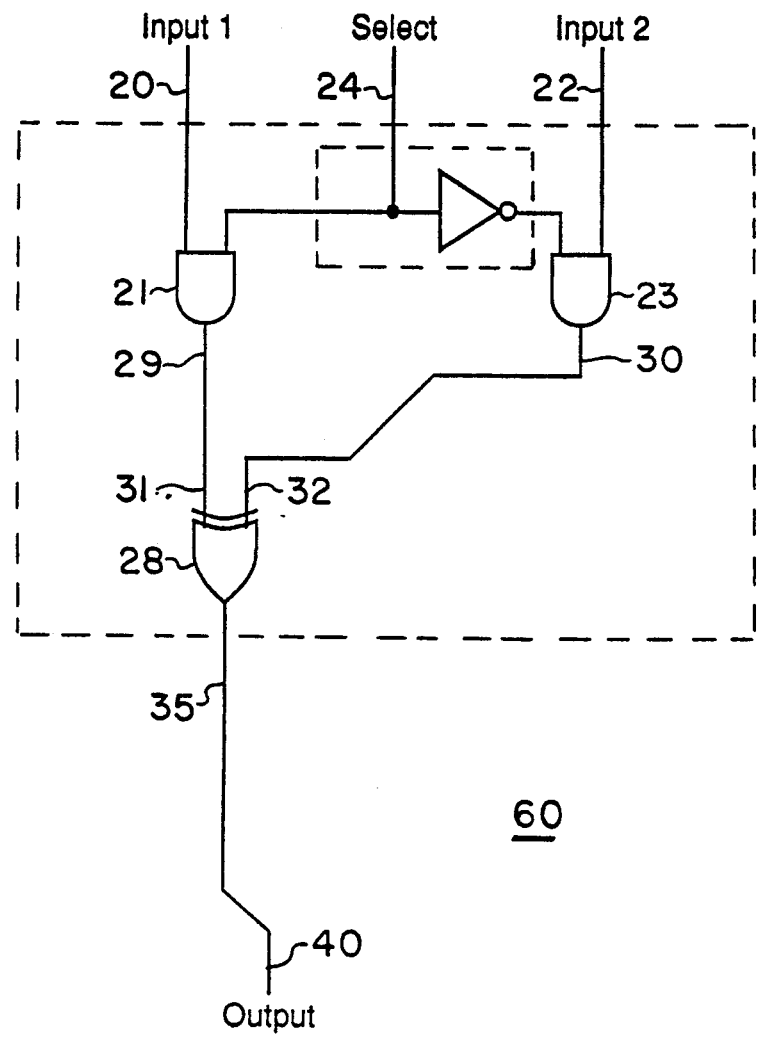
FIG. 5 is a logic diagram illustrating how the cell core of FIG. 2 is configured to implement a multiplexer function.

FIG. 5 illustrates the configuration of the cell core of FIG. 2 as a multiplexer 60. This function represents an important advantage of the cell core of the present invention over the cell provided in the '415 application in which such a multiplexer requires six cells. In the multiplexer configuration 60 depicted in FIG. 5, the configurable-interconnect element is configured in state 50a and multiplexer 36 is configured to select the output 35 of XOR gate 28. When input 24 to the configurable-interconnect element is logical "1", the first logical input 20 which feeds the first upstream AND gate 21 is provided to the output 35 of the XOR gate. When the configurable-interconnect element input 24 is logical "0", the second logical input 22 of the second upstream AND gate 23 is provided to the output 35 of the XOR gate.

Conventionally, the combinational element used downstream in such a multiplexer to combine the outputs of the upstream AND gates would be an OR gate. Instead, the cell core of the present invention employs an XOR gate 28. It is possible to use an XOR gate in the circuit of FIG. 5 since the OR and XOR gates function identically except when both inputs are logical "1"s and configurable-interconnect element 25 makes it impossible for both inputs to be logical "1"s when element 25 is in state 50a. The advantage of using an XOR gate 28 in this position is that it is also useful in implementing many important arithmetic circuits, such as adders and counters.

Figure 6:
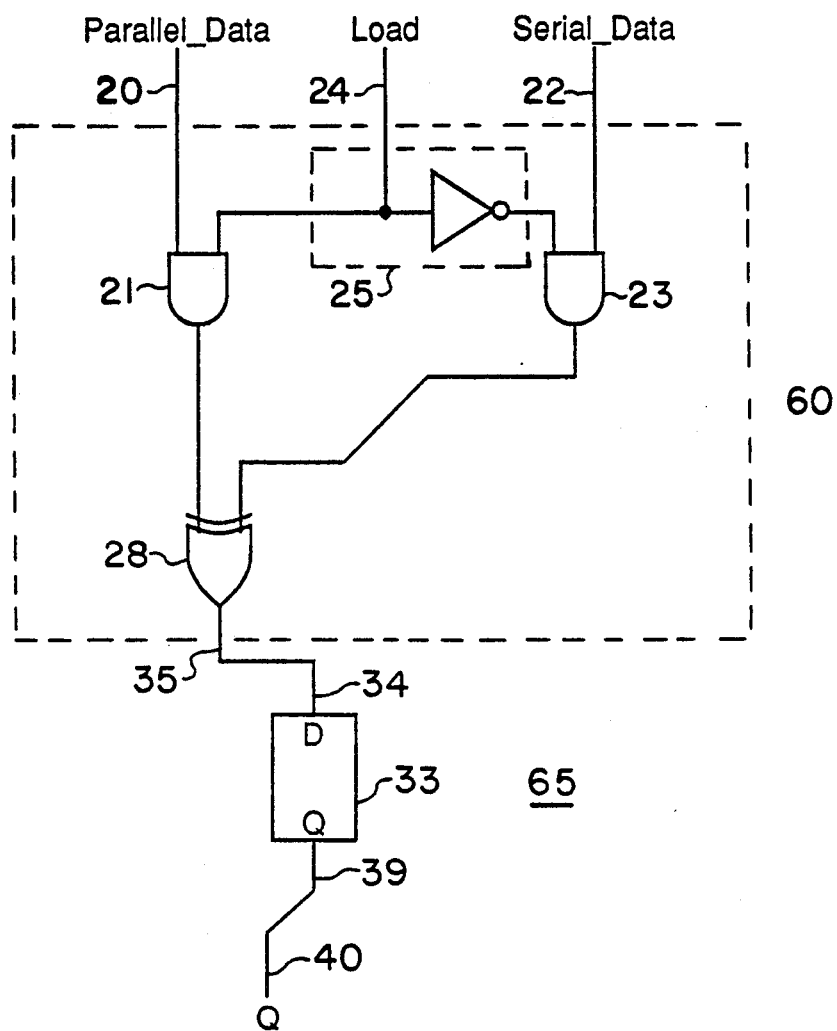
FIG. 6 is a logic diagram illustrating how the cell core of FIG. 2 is configured to implement a 1-bit slice of a parallel-loadable shift register.

FIG. 6 depicts the cell core of FIG. 2 configured to function as a 1-bit slice of a parallel-loadable shift register 65. As with the previous multiplexer configuration 60, the configurable-interconnect element 25 in FIG. 6 is configured in state 50a but the multiplexer 36 is now configured to select input 37, the Q output 39 of register 33. Thus, FIG. 6 is the same as FIG. 5 except for the inclusion of register 33; and multiplexer 60 of FIG. 5 is identified in FIG. 6 by the dashed line.

The operation of the parallel-loadable shift register configuration is based upon that of the previously described multiplexer configuration 60 using the signal on input 24 as a load signal. When the signal on input 24 entering the configurable-interconnect element 25 is logical "1", the multiplexer configuration 60 supplies Parallel_Data 20 to the D input 34 of the register 33. When the signal on input 24 is logical "0", the multiplexer configuration 60 supplies Serial_Data from the previous slice to the D input 34 of the register 33.

Figure 7:
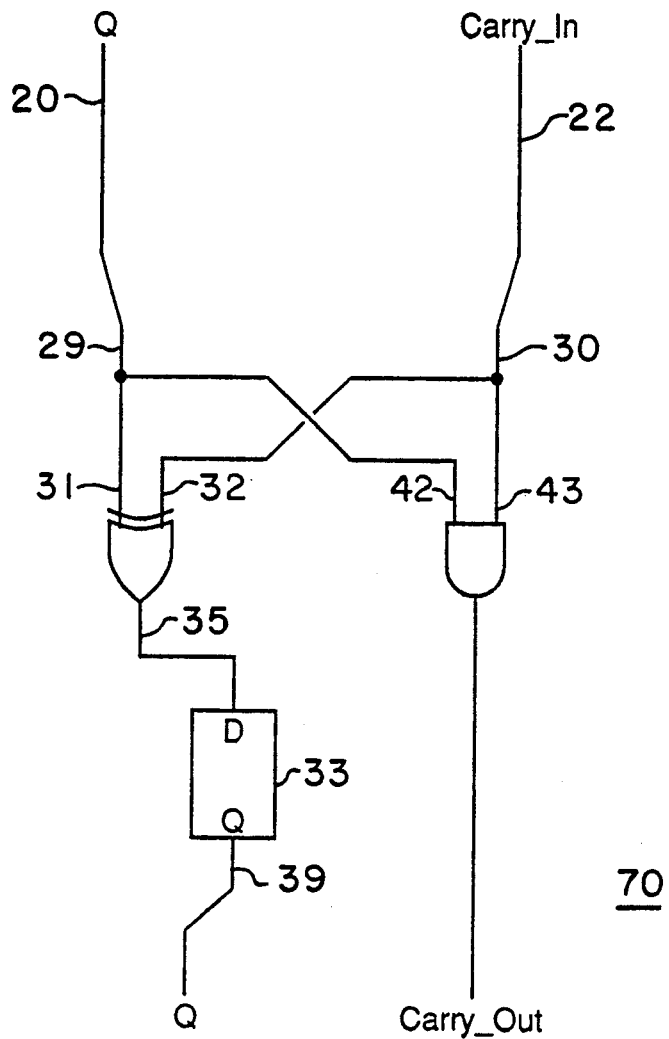
FIG. 7 is a logic diagram illustrating how the cell core of FIG. 2 is configured to implement the logic for a 1-bit slice of a binary counter.

FIG. 7 shows the cell core of FIG. 2 configured to implement the logic for a 1-bit slice of a binary counter 70. To implement the counter slice, the configurable-interconnect element 25 is configured in state 50b, so as to cause the upstream AND gates 21 and 23 to act as logical wires, and the multiplexer 36 is configured to select the Q output 39 of register 33. In order to fully realize the binary counter function, the Q output 39 of the register 33 must be fed back to the first logical input 20. This feedback connection may be implemented using an adjacent cell or other feedback means, such as feedback means 110 shown in the cell embodiments shown in FIGS. 17 and 18.

Figure 8:
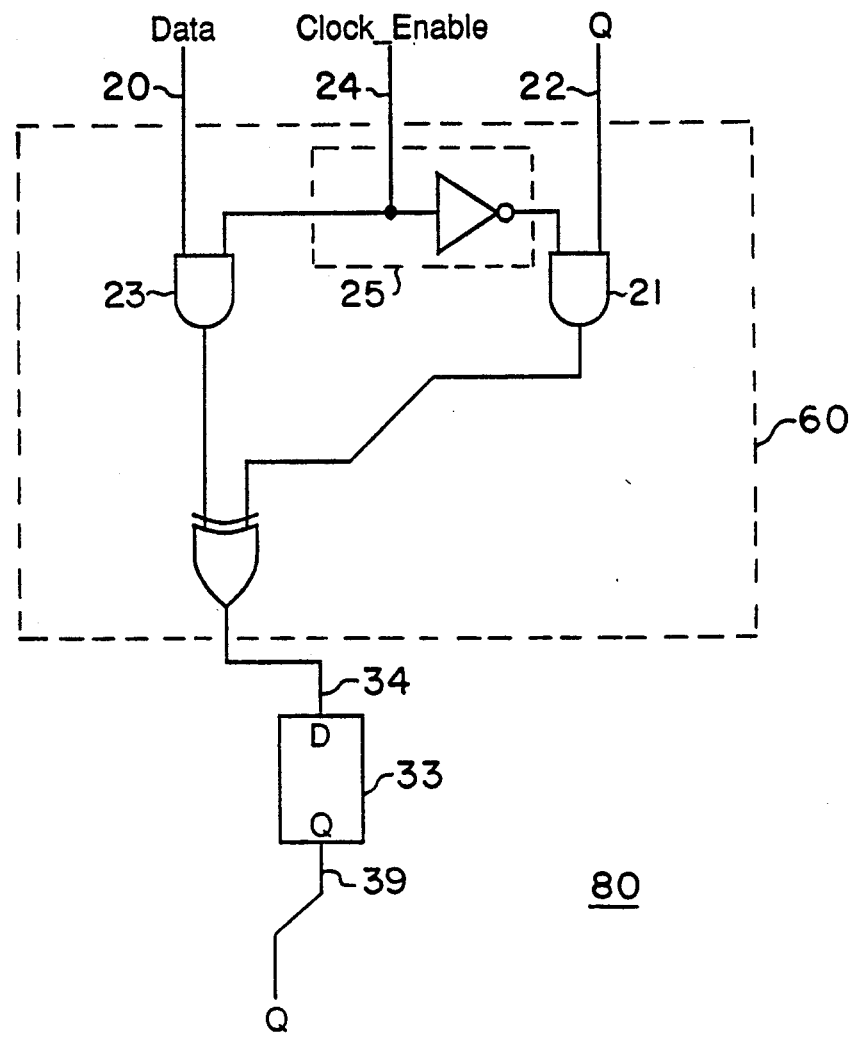
FIG. 8 is a logic diagram illustrating how the cell core of FIG. 2 is configured to implement the logic for a register with clock enable.

FIG. 8 depicts the cell core of FIG. 2 configured to implement a register 80 with clock enable. This register configuration employs the multiplexer configuration 60 to select an appropriate input 34 for the register 33. The configurable-interconnect element 25 is configured in state 50a and the multiplexer 36 is configured to select the Q output 39 of register 33. In this example, the signal on input 24 functions as a clock enable. When the clock-enable signal on input 24 entering the configurable-interconnect element 25 is logical "1", register 33 receives new Data 20 at its input 34 through the multiplexer configuration 60. When the clock enable signal on input 24 is logical "0", register 33 is re-loaded with its current state 39, which is returned upstream via an adjacent cell or internal feedback means 110 as provided in FIGS. 17 and 18, and back to the input 34 of register 33 by the multiplexer configuration 60.

FIGS. 9A-9D illustrate programmable pass gates with default outputs that are useful in the present invention. A programmable pass gate with default "1" output is shown as circuit 70a in FIG. 9A and its equivalent logic symbol 70b in FIG. 9B. Pass gate 70a receives an input at terminal 71 and generates an output at terminal 72. It also receives two logically inverted signals 28a and 28b from the configuration control. In a "pass" state when signal 28a is high (and 28b is consequently low), the value at the input at terminal 71 is passed to the output at terminal 72 by pass gate 70a. In a "default" state when signal 28a is low, pass gate 70a supplies the default "1" connected to node 71a to the output terminal 72. In logical symbol 70b shown in FIG. 9B, the inverted configuration control signals 28a and 28b are represented by the single configuration control signal 28a.

Figure 9B:
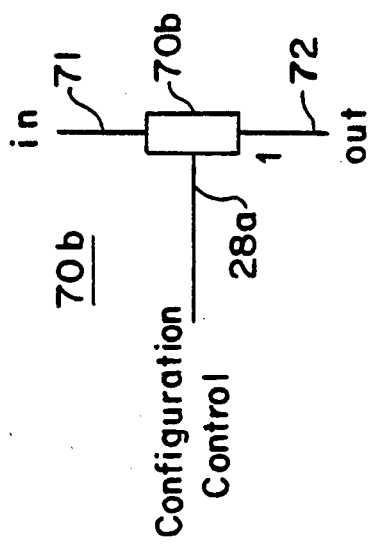
FIGS. 9A-9D are diagrams showing the circuit implementations and logic symbols for the default "1" and default "0" programmable pass gate elements employed in several of the logic cell embodiments of the present invention.
Figure 9D:
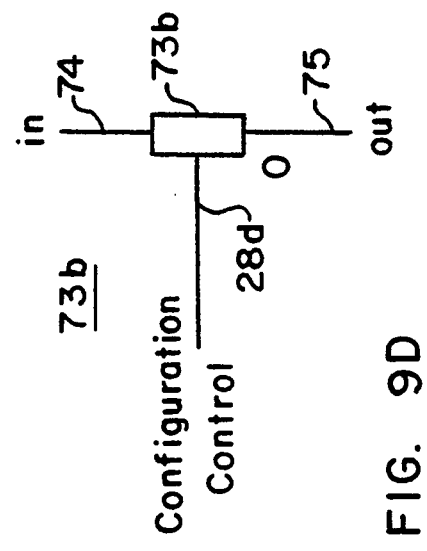
Figure 9A:
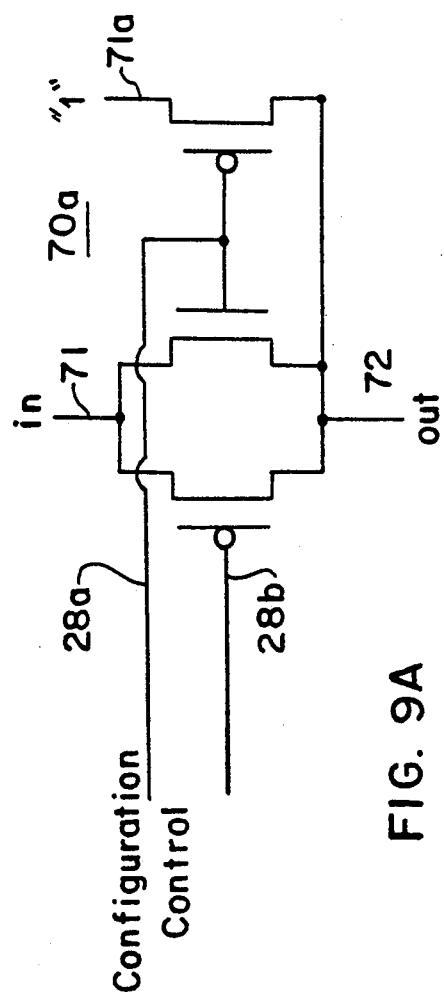
Figure 9C:
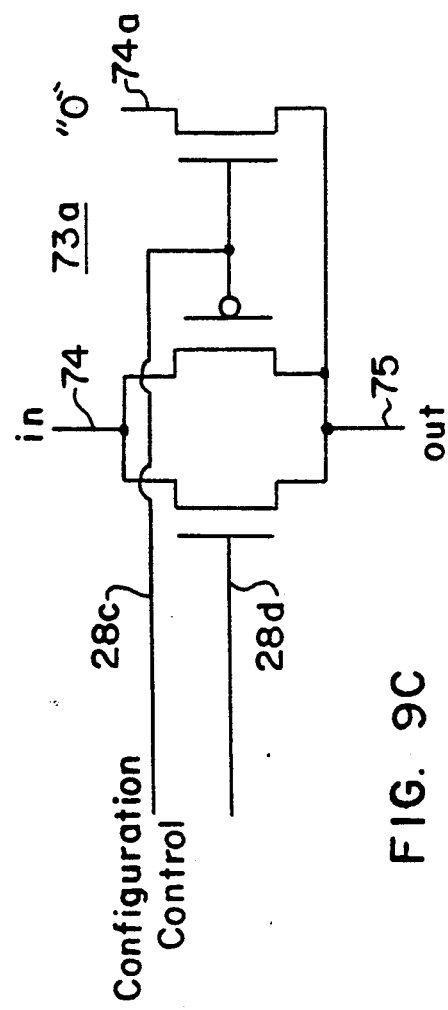

A similar programmable pass gate is shown as circuit 73a of FIG. 9C. Pass gate 73a, however, has a default "0" output. In a "pass" state when configuration signal 28d is high (and 28c is low), pass gate 73a passes the input value at terminal 74 to the output at terminal 75. In a "default" state when signal 28d is low, pass gate 73a supplies the default "0" connected to node 74a to the output terminal 75.

The logical symbol for the programmable pass gate with default "0" output 73b is shown in FIG. 9D. The programmable pass gate logic symbols 70b and 73b are used in the drawings of logic cells in FIGS. 11-14 and 17-18.

Figure 10B:
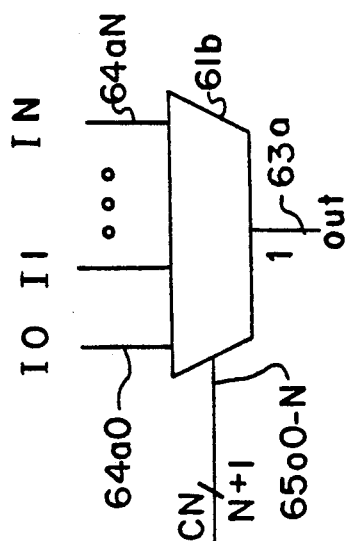
FIGS. 10A-10D are diagrams showing the circuit implementations and logic symbols for the default "1" and default "0" programmable multiplexer elements employed in several of the logic cell embodiments of the present invention.
Figure 10D:
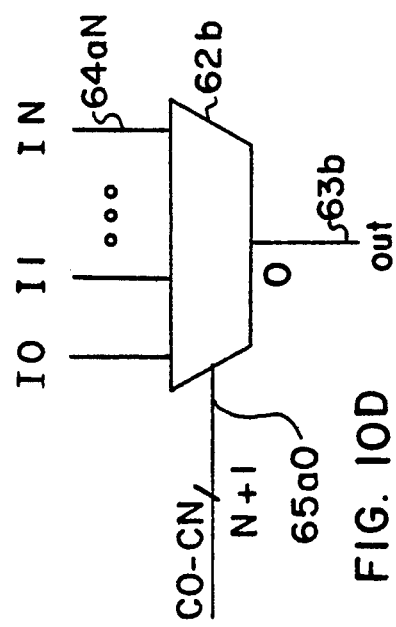
Figure 10A:
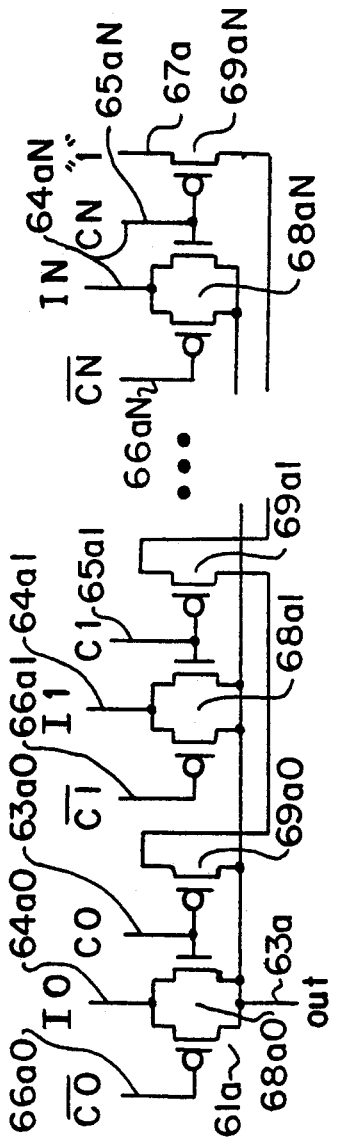
Figure 10C:
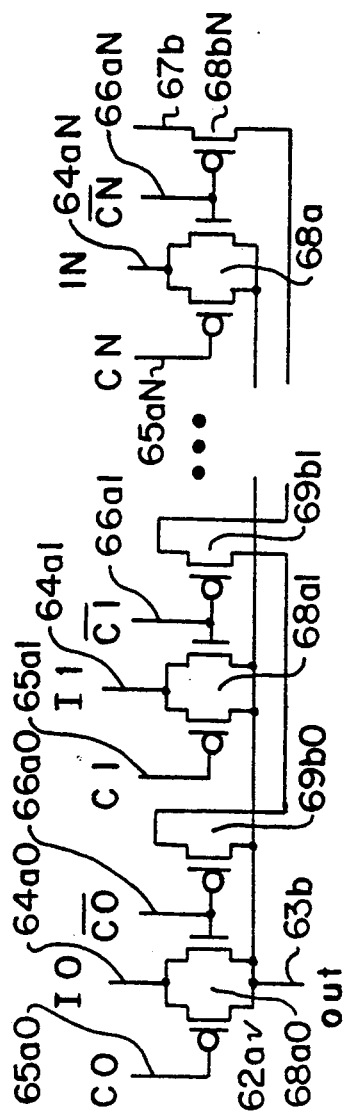

The same basic idea used to implement the programmable pass gates 70a and 73a with default "1" and default "0" outputs can be extended to implement general (N+1)-input multiplexer circuits 61a and 62a with default "1" and default "0" outputs, as illustrated in FIGS. 10A and 10C. Circuit 61a is an (N+1)-input programmable multiplexer with default "1" output. Its equivalent logic symbol is shown in FIG. 10B as 61b. Multiplexer 61a comprises (N+1) CMOS transmission gates 68a0-N and a chain of (N+1) PMOS transistors 69a0-N.

Multiplexer 61a selects one of (N+1) inputs 64a0-N to connect to output 63a by opening the appropriate transmission gate 68a0-N in response to the values of the configuration control lines 65a0-N and their logical inverses 66a0-N. If all the configuration control lines 65a0-N are programmed to "0" such that no input is selected, multiplexer 61a directs a "default" value, the logical "1" supplied at input 67a, to output 63a via the chain of PMOS transistors 69a0-N.

A programmable multiplexer with default "0" output 62a and its equivalent logic symbol 62b are shown in FIGS. 10C and 10D. Multiplexer 62a comprises (N+1) CMOS transmission gates 68a0-N and a chain of (N+1) NMOS transistors 68b0-N. Multiplexer 62a selects one of (N+1) inputs 64a0-N to connect to output 63b by opening the appropriate transmission gate 68a0-N in response to the values of the configuration control lines 65a0-N and their logical inverses 66a0-N. If all the configuration control lines 65a0-N are programmed to "0" such that no input is selected, multiplexer 62a directs a "default" value, the logical "0" supplied at input 67b, to output 63b via the chain of NMOS transistors 68b0-N. The equivalent logic symbols 61b and 62b of FIGS. 10B and 10D for the default output multiplexers are used in the logic diagrams of the cell embodiments shown in FIGS. 11-14 and 17-18.

This "default" state is particularly valuable in the context of a configurable logic cell, since most cells in an array will typically be configured with such multiplexers in their default state. The default output multiplexer circuits shown in FIGS. 61a and 62a are smaller, in terms of chip area, than similar conventional circuits since these default output multiplexer circuits use the same control lines to control both the transmission gates and the transistor chain. Another advantage is that, depending on the desired default value, the transistor chain only includes one type of transistor (P or N), saving valuable chip area without introducing any undesirable threshold voltage drops.

FIGS. 11 through 14 show various embodiments of the logic cell in accordance with the present invention for use in an array such as that shown in FIG. 1. Collectively, these embodiments represent only a few of the possible cells incorporating the ideas present in the cell core illustrated in FIG. 2.

All of the cell designs depicted in FIGS. 11 through 14 are perfectly symmetric with respect to the North, South, East and West directions in the array. Unless otherwise indicated, all configurable devices (pass gates and multiplexers) included in FIGS. 10 through 14 are independently programmable. Finally, bus outputs are omitted from FIGS. 10 through 14 since they are not relevant to the present invention.

Figure 11:
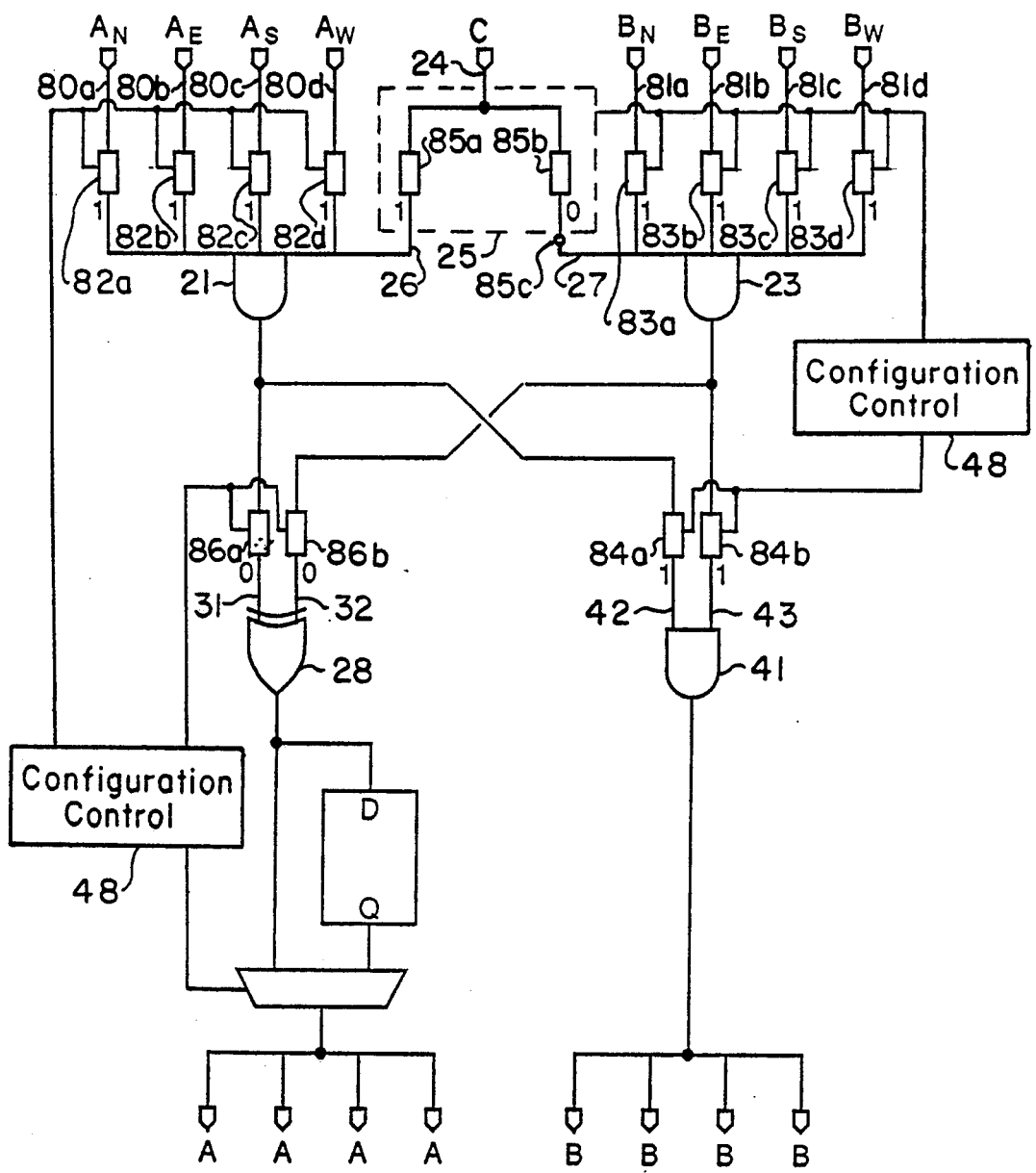
FIG. 11 is a logic diagram showing one embodiment of the improved logic cell in accordance with the present invention for use in an array as depicted in FIG. 1.

The logic cell depicted in FIG. 11 augments the cell core of FIG. 2 in several ways to realize a cell for use in an array. Additional inputs 80a–d and 81a–d to the two upstream AND gates 21 and 23 accommodate the four "A" and four "B" inputs from neighboring cells. Four "A" outputs and four "B" outputs are provided from multiplexer 36 and AND gate 41, respectively.

Two programmable pass gates 85a and 85b and inverting bubble 85c, which form the configurable-interconnect element 25, allow the left and right outputs 26, 27 from the configurable-interconnect element to be independently controlled. Two programmable pass gates 86a and 86b feeding the inputs 31 and 32 of the downstream XOR gate 28 and two programmable pass gates 84a and b feeding the inputs 42 and 43 of the downstream AND gate 41 permit each of these gates 28 and 41 to act as logical wires when one of its input pass gates is configured in the "pass" state and the other in the "default" state. Programmable pass gates 82a–d, 83a–d and 85a–b on each of the inputs 80a–d and 8ia–d plus the outputs from the configurable-interconnect element 25 allow each of the two upstream AND gates 21 and 22 to implement either a two-, three-, four-, or five-input AND function. In addition, by configuring pass gates 84a and 84b in the "pass" configuration to utilize the downstream AND gate 41, an AND function of up to nine inputs 80a–d, 24 and 81a–d is possible. The advantages of the cell of FIG. 11 include very wide ANDing and minimal use of multiplexers (thus reducing area).

Figure 12:
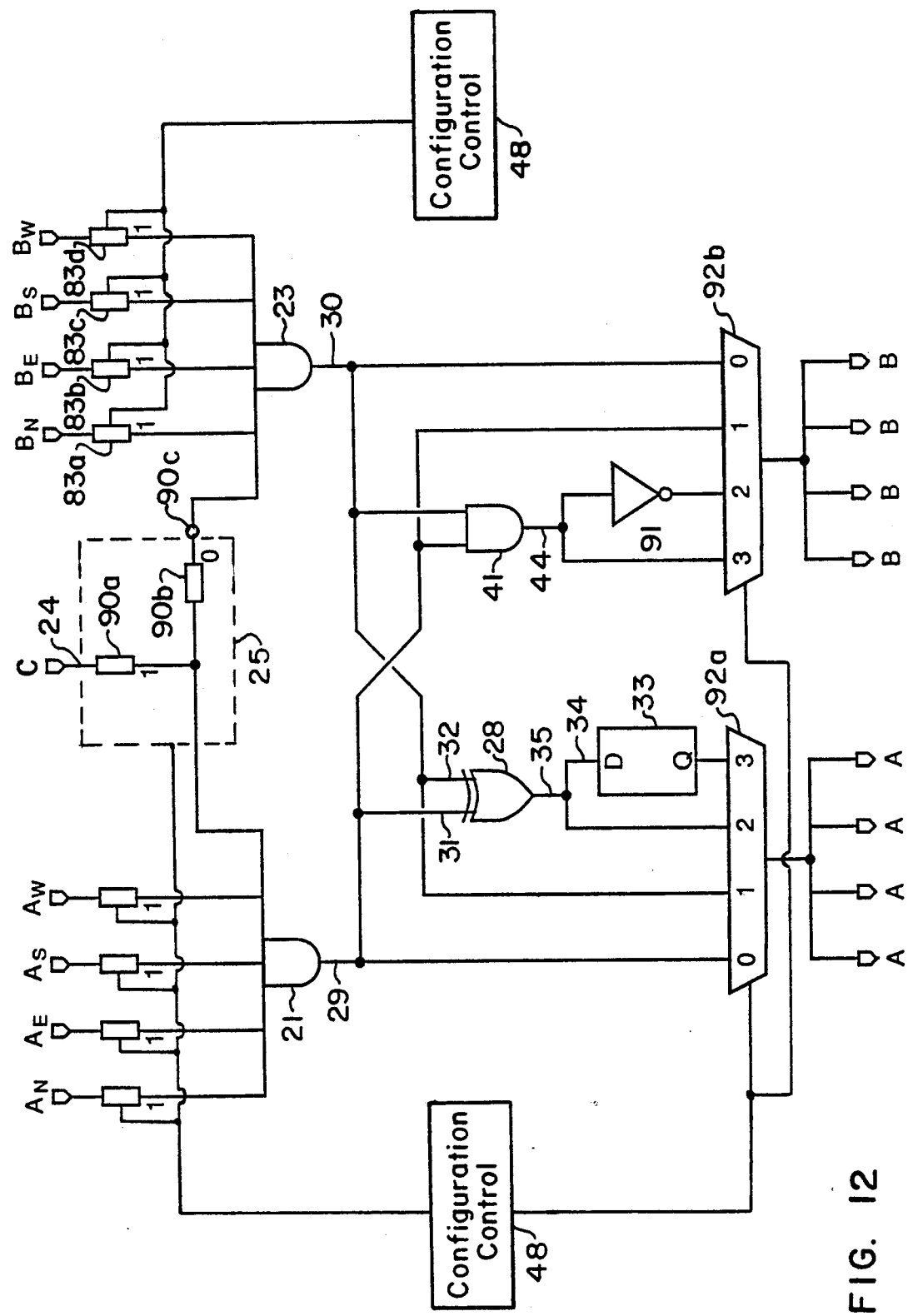
FIG. 12 is a logic diagram showing another embodiment of the improved logic cell in accordance with the present invention for use in an array as depicted in FIG. 1.

The cell shown in FIG. 12 combines the elements of the previously described cell of FIG. 11 with those of cells described in the above referenced '736 patent and '415 application. The cell shown in FIG. 12 has the two five-input AND gates 21 and 23, the downstream XOR gate 28, the register 33, and the downstream AND gate 41 which come from the cell of FIG. 11. In addition, the cell of FIG. 12 includes an arrangement of configurable pass gates 90a and 90b and inverting bubble 90c which form the configurable-interconnect element 25 and an inverter 91 which can be programmably inserted following the output 44 of the downstream AND gate 41. The two programmable pass gates 90a and 90b associated with the configurable-interconnect element 25 provide additional capabilities beyond those previously discussed. When configuration-interconnect element 25 is configured in state 50d, pass gate 90a is configured in the "default" state and pass gate 90b is configured in the "pass" state, the output 30 of upstream AND gate 23 is forced to logical "0." In addition to making a logical "0" available at both the "A" and "B" outputs of the cell, this "0" constant at the input 31 of the downstream XOR gate 28 turns XOR gate 28 into a logical wire from input 32 to output 35, which is essential in implementing a 1-bit-slice-per-cell shift register.

In addition, the output 30 of upstream AND gate 23 can be forced to logical "1" by programming pass gates 83a–d and 90b in the "default" state. In this case, the logical "1" at input 32 of the downstream XOR gate 28 turns XOR gate 28 into an inverter from input 31 to output 35, which means that an inverter may precede the input 34 to the register 33 within a single cell or may be connected to the "A" output of the cell.

In the cell of FIG. 12, configurable output-selecting multiplexers 92a and 92b are added. Preferably, multiplexers 92a and 92b are controlled in tandem to reduce area and configuration-control requirements. The ability to configure the downstream AND gate 41 to be followed by an inverter 91 or not followed by an inverter is provided by multiplexer 92b. This adds flexibility. With the multiplexers 92a and 92b set in state "2" so as to select the "2" inputs as their outputs, the inverter 91 is in the signal path, the XOR function is provided on the "A" side 40 and the NAND function on the "B" side 45 of the cell. The NAND by itself is a universal logical function and, when combined with the XOR, permits a full adder to be implemented using only four cells. With the multiplexers 92a and 92b configured in state "3" so as to select the "3" inputs as their outputs, the cell may be advantageously used to implement one stage of a binary counter using only two cells. The advantages of the cell illustrated in FIG. 12 also include very wide ANDing and the availability of the NAND function.

Figure 13:
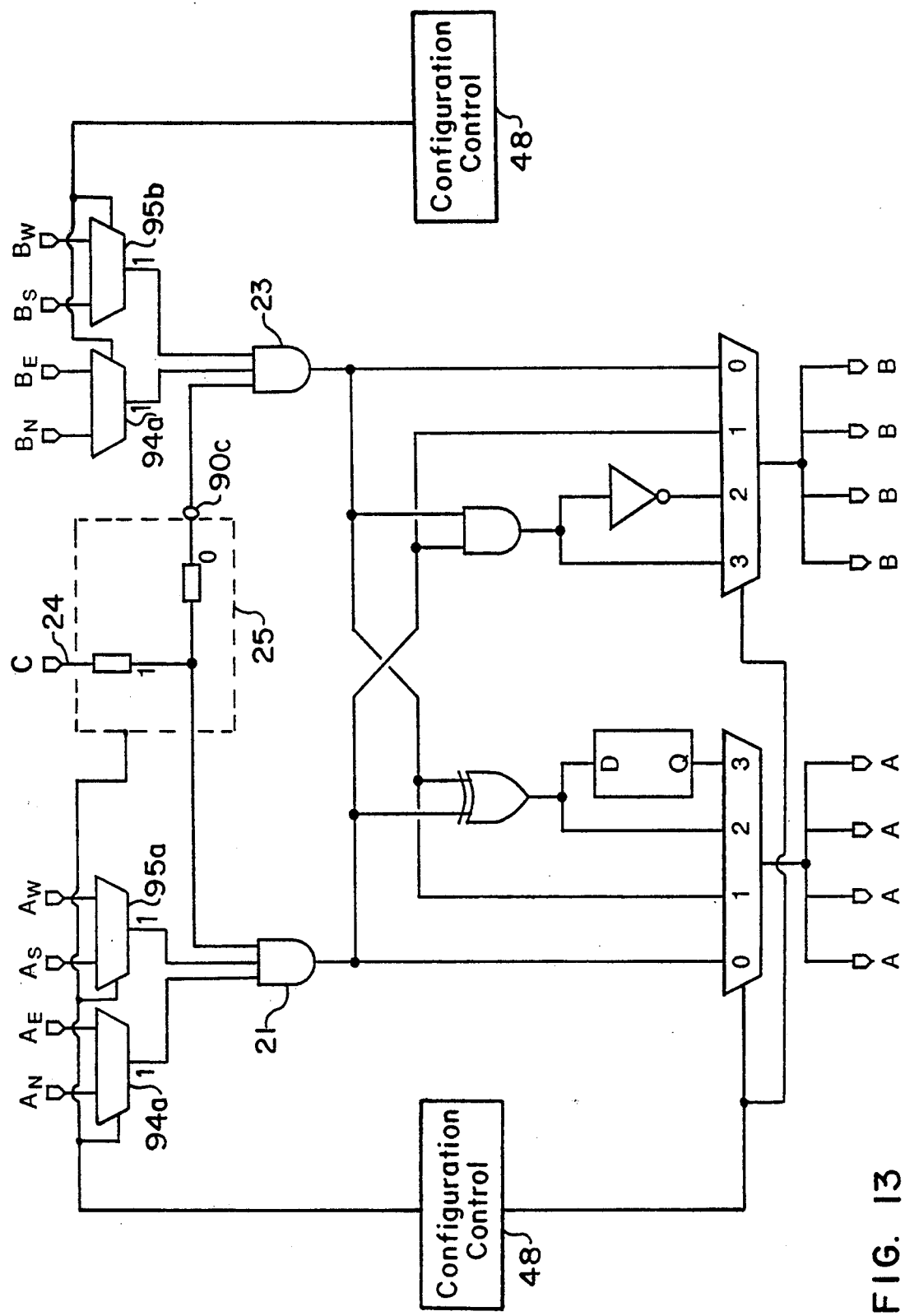
FIG. 13 is a logic diagram showing still another embodiment of the improved logic cell in accordance with the present invention for use in an array as depicted in FIG. 1.

In the cell shown in FIG. 13, the eight configurable pass gates previously associated with AND gates 21 and 23 are replaced by multiplexers 94a–b and 95a–b, each of which may be configured to produce a default logical "1" at its output. This change reduces the fan-in to the upstream AND gates 21 and 23, thereby increasing the speed of those gates. This is the only difference between the cell shown in FIG. 13 and that shown in FIG. 12. The advantages of the cell shown in FIG. 13 include moderately wide ANDing capability and better performance than that of the cell in FIG. 12 because of reduced fan-in to the upstream AND gates.

Figure 14:
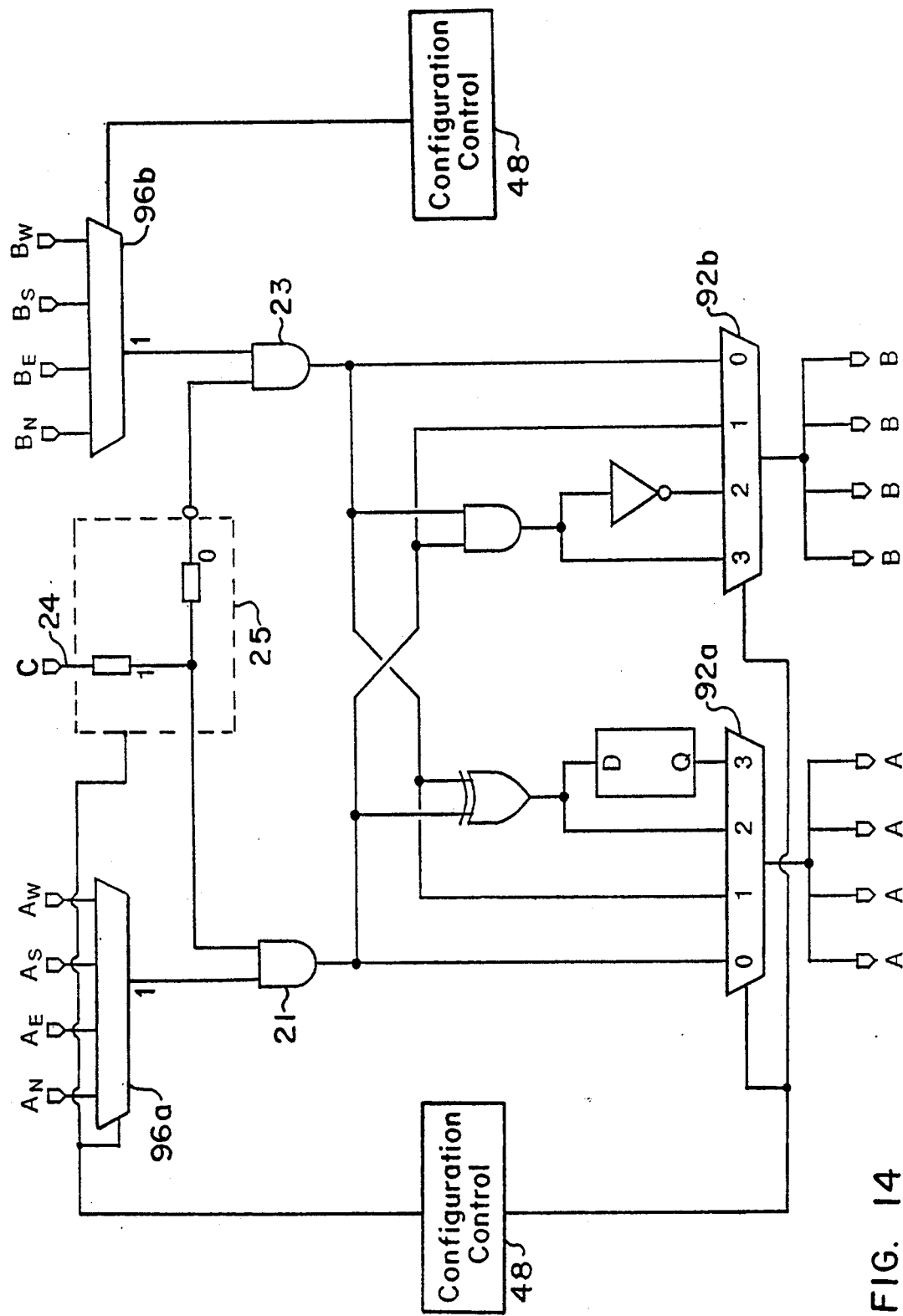
FIG. 14 is a logic diagram showing a preferred embodiment of the improved logic cell in accordance with the present invention for use in an array as depicted in FIG. 1.

A preferred embodiment of the logic cell in accordance with the present invention is shown in FIG. 14. In the cell of FIG. 14, the multiplexers 96a–b are each programmable to select one of the nearest-neighbor inputs to be provided to the input of the upstream AND gates 21 and 23. As with multiplexers 94a–b and 95a–b in the previous cell, multiplexers 96a–b may also be programmed to provide a logical "1" output. This reduction in the number of multiplexed inputs entering the upstream AND gates 21 and 23 is the only difference between the preferred embodiment cell and that of FIG. 13. The advantage of the preferred embodiment shown in FIG. 14 is the high performance obtainable by reducing the fan-in AND gates 21 and 23 from the design.

Figure 15A:
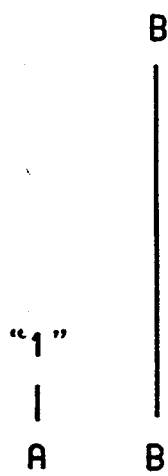
FIGS. 15A-15YY is a series of logic diagrams of illustrative configuration states of the preferred logic cell embodiment shown in FIG. 14.
Figure 15B:
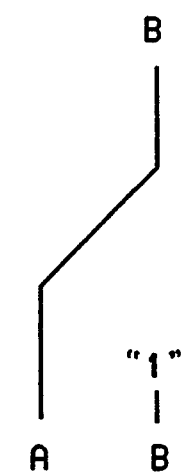
Figure 15C:
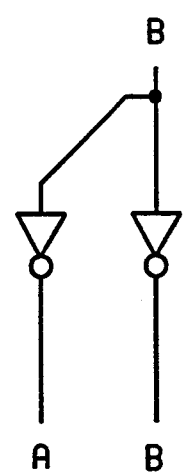
Figure 15D:
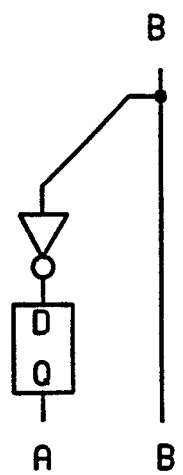
Figure 15E:
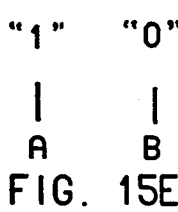
Figure 15F:
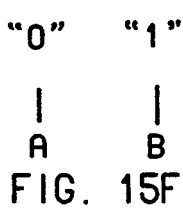
Figure 15G:
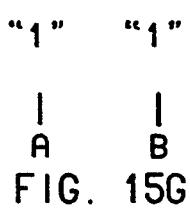
Figure 15H:
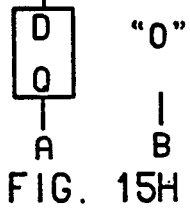
Figure 15I:
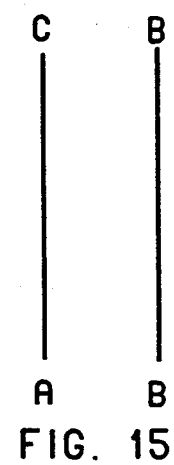
Figure 15J:
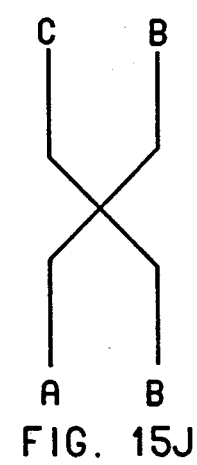
Figure 15K:
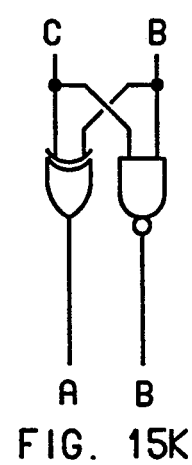
Figure 15L:
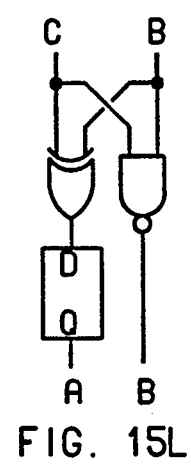
Figure 15M:
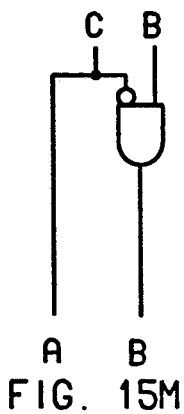
Figure 15N:
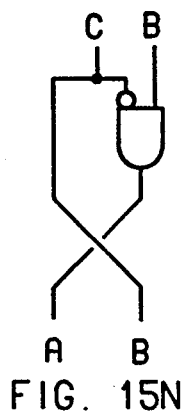
Figure 15O:
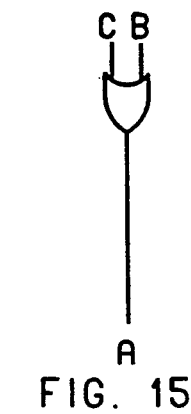
Figure 15P:
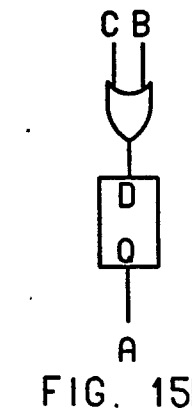
Figure 15Q:
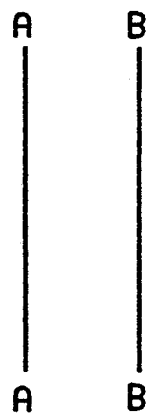
Figure 15R:
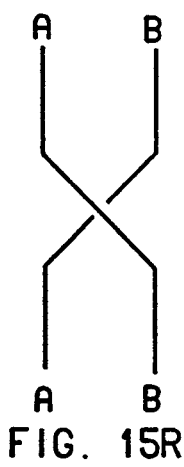
Figure 15S:
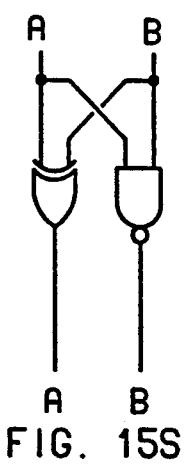
Figure 15T:
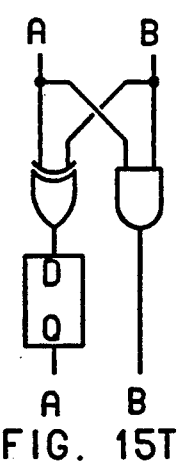
Figure 15U:
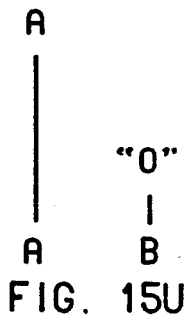
Figure 15V:
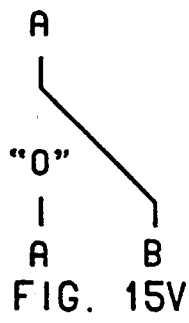
Figure 15W:
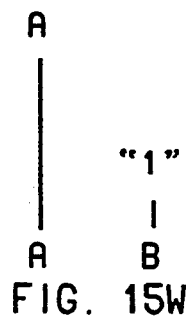
Figure 15X:
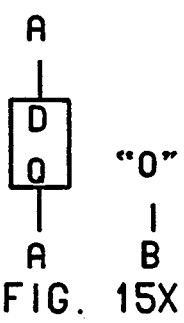
Figure 15Y:
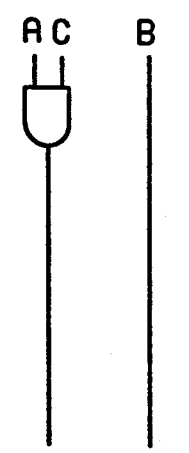
Figure 15Z:
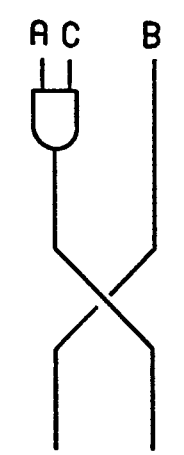
Figure 15A:
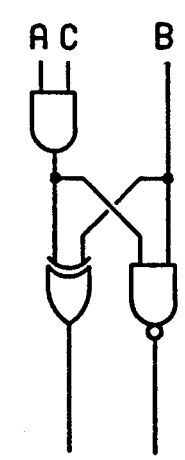
Figure 15B:
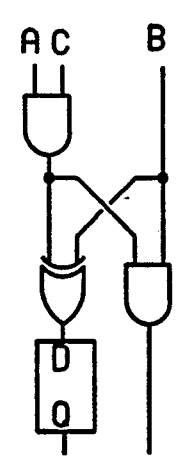
Figure 15C:
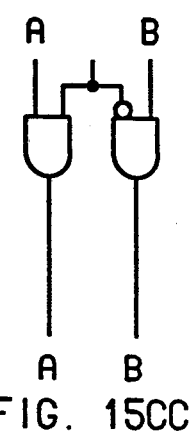
Figure 15D:
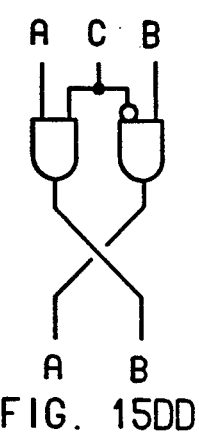
Figure 15E:
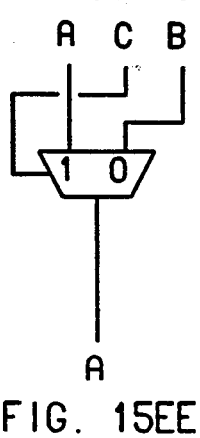
Figure 15F:
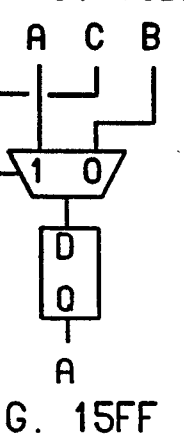
Figure 15G:
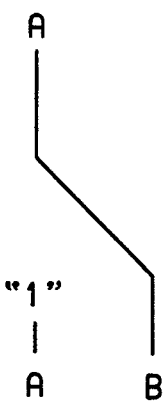
Figure 15H:
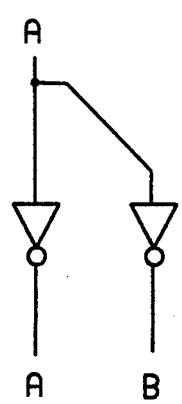
Figure 15I:
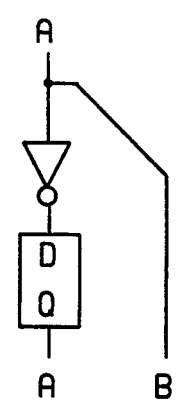
Figure 15J:
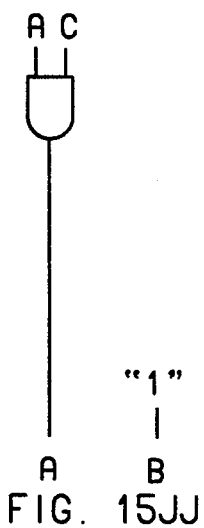
Figure 15K:
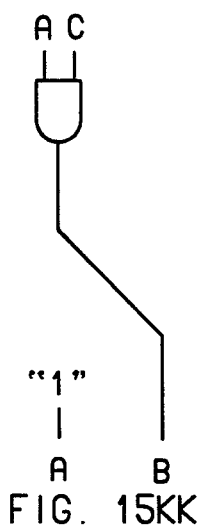
Figure 15L:
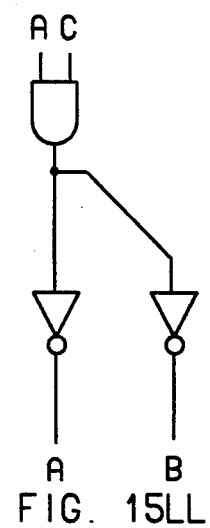
Figure 15M:
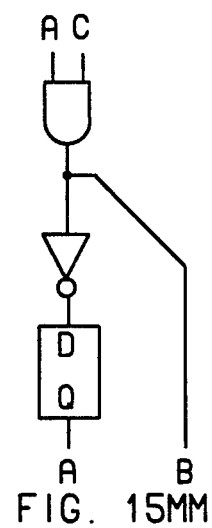
Figure 15N:
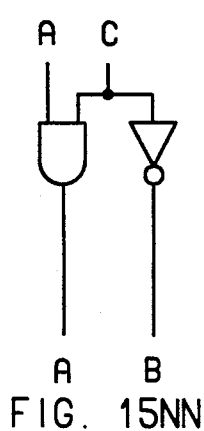
Figure 15O:
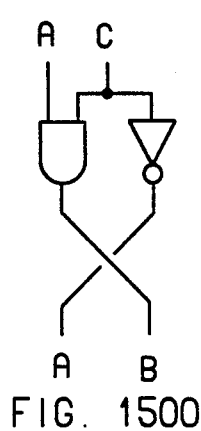
Figure 15P:
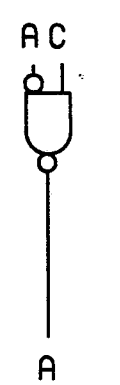
Figure 15Q:
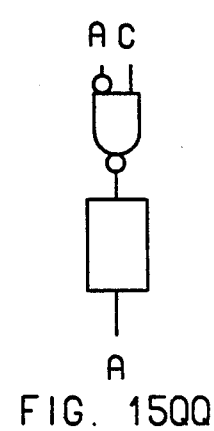
Figure 15R:
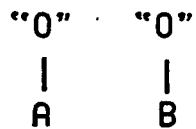
Figure 15S:
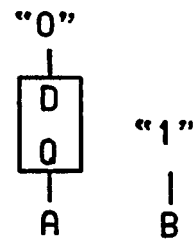
Figure 15T:
Figure 15U:
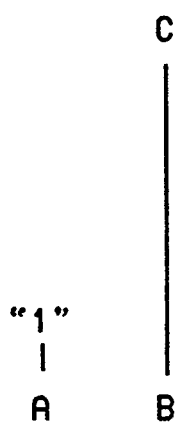
Figure 15V:
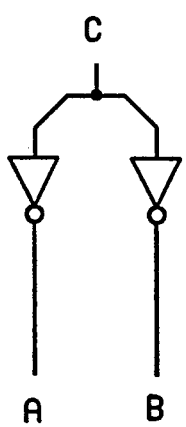
Figure 15W:
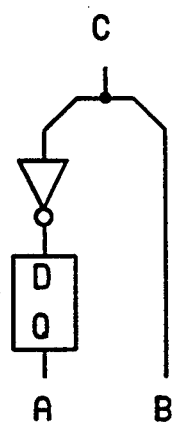
Figure 15X:
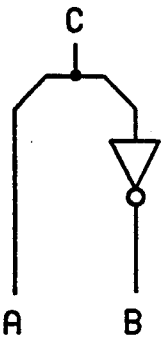
Figure 15Y:
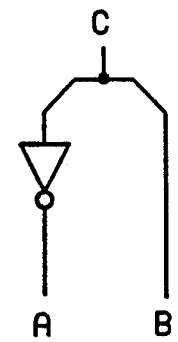

Fifty-one configuration states of the preferred embodiment cell are depicted in FIGS. 15A–15YY. The set of states shown in FIGS. 15A–15YY does not include separate states for each possible configuration of the input multiplexers 96a and 96b, nor does it include bus states. As evidenced by FIGS. 15A–15YY, the design of FIG. 14, based on the cell core of FIG. 2, implements a large variety of useful logical functions, only a few of which have been described in detail.

All of the cell embodiments depicted thus far in FIGS. 11–14 have the property that two nets, at most, can be routed through the cell in spite of the fact that the cell has eight inputs from neighboring cells and eight outputs to neighboring cells. Thus, when two nets are routed through a cell, all other possible connections between unused cell inputs and outputs are blocked. These inputs and outputs, furthermore, are divided into "A" and "B" classes, and, on some occasions, it is necessary to use a cell solely to change a signal from "A" to "B" or "B" to "A". This is called "color clash", since different colors are usually associated with the "A" and "B" signals.

An alternative logic array is depicted in FIG. 16. FIG. 16 shows the direct interconnections within an exemplary portion of an array of cells 100 formed in accordance with the present invention. Like the array of FIG. 1, the cells are arranged in a two-dimensional matrix with each cell 100 having four nearest-neighbors, one to its left (or to the West), one to its right (or to the East), one above it (or to the North) and one below it (or to the South). Unlike FIG. 1, each cell 100 has four inputs 101a, 101b, 101c, and 101d and four outputs 102a, 102b, 102c, and 102d. Like the array of the FIG. 1, each cell 100 is identical with respect to its direct connections to its four nearest-neighbors. However, to each such neighbor, the cell 100 provides only one output, and from each neighbor, the cell 100 receives only one input. Because there is only one type of input and output (no "A"s and "B"s), color clash is completely eliminated. As with the array of the '415 application, this array may include an additional bus structure which is not shown since it is not relevant to the present invention.

FIG. 17 is a logic diagram showing an embodiment of a logic cell in accordance with the present invention for use in an array as depicted in FIG. 16. The basic design of this cell is derived from that of FIG. 14. There are four important differences. First, both input multiplexers 103a and 103b now receive the same inputs. In this case, these are simply the inputs 101a-d received from outputs of the nearest-neighbor cells. As with the cells in FIGS. 11-14, input 24 to the configurable-interconnect element may originate from a bus network, nearest-neighbor cell, some other source or some combination of these. Second, the four-input output-selecting multiplexers 92a and 92b, controlled in tandem in the cell of FIG. 14, are replaced by two two-input output-selecting multiplexers 104a and 104b, also controlled in tandem to produce two output functions $F_0$ and $F_1$. Multiplexer states "0" and "1" from the cell of FIG. 14 are eliminated from the present cell. Third, the Q output 39 of register 33 is fed back into an input of input selecting multiplexer 103a via an internal feedback means 110. This feature allows the 1-bit slice of the binary counter shown in FIG. 7 or the register with clock-enable function shown in FIG. 8 to be completely implemented within a single cell. Fourth and finally, the four cell outputs 102a-d are each determined by a separate five-input output-selecting multiplexer 106a, 106b, 106c, and 106d. Each output-selecting multiplexer may select either of the logical output functions $F_0$ or $F_1$, or may alternatively select one of the inputs from the three sides other than that to which the output is being transmitted. Except for U-turns, this solves the blocking problem. However, such U-turn routing is only useful for implementing the feedback path for an adjacent cell which, in this case, is provided intra-cell by feedback means 110. The advantages of the cell in FIG. 17 include no color clash and no blocking, except for U-turns.

FIG. 18 is a logic diagram of an alternative cell in accordance with the present invention for use in an array as shown in FIG. 16. The only difference between this and the previous cell of FIG. 17 is the additional flexibility in output select multiplexers 107a, 107b, 107c, and 107d. In the cell of FIG. 18, these output-selecting multiplexers 107a-d can each be independently configured to select any of four possible output functions $F_0$, $F_1$, $F_2$, and $F_3$, only two of which could be selected in the cell of FIG. 17. In addition, the output-selecting multiplexers 107a-d of the cell in FIG. 18 are independently controlled, offering additional flexibility. The advantages of the cell shown in FIG. 18 include no color clash, no blocking (except U-turns), and maximum flexibility.

From the foregoing description of the invention, numerous alterations, modifications and improvements may be readily apparent. FIGS. 11-14 and 17-18 have illustrated several embodiments of the improved logic cell in accordance with the present invention. Many functionally similar embodiments are possible. These include, but are not limited to, implementations of logic cells based on negative-logic equivalents of the cell core and implementations of arrays in which cells such as those disclosed herein are arranged in other geometrical patterns such as hexagonal or are interconnected by other wiring patterns such as a three-dimensional array.

In augmenting the logic of the cell core to create a complete cell design, a variety of design choices are possible, several of which were illustrated by the cell designs shown in FIGS. 11-14 and 17-18. However, all such cell designs based on the cell core disclosed herein remain within the scope and spirit of the present invention, regardless of the nature of various design choices. In particular, design choices worth considering might include using XOR gates with one programmable input signal to implement connections between elements of the cell core whereby the XOR gate may be programmed either to implement a logical wire or an inverter, depending on the selection of its programmable input. Also, the use of independent vs. dependent control of various multiplexers represents a design tradeoff between flexibility and size/power consumption. It is also possible to include in a cell some capability for the cell to automatically determine some of its configuration based upon the configurations of neighboring cells and/or a bussing network. As another possible design choice, it may be useful to include among the inputs to each of the two output-selecting multiplexers in FIGS. 12-14, all the outputs entering either multiplexer such that both output-selecting multiplexers include the same set of inputs, effectively eliminating the "color clash" problem. These, and numerous other design choices will yield a vast collection of different cell designs based collectively on the cell core of the present invention. Therefore, the scope of the present invention shall be limited only in accordance with the following claims.

What is claimed is:

1. A prorammable logic circuit comprising:
   first, second and third logic gates, each having at least first and second inputs and at least a first output, said first and second inputs to the third logic gate being connected to the first outputs of the first and second logic gates, respectively; and
   a configurable-interconnect element having a first input and first and second outputs, said first output being connected to the first input of the first logic gate and said second output being connected to the first input of the second logic gate, the configurable-interconnect element also having means for generating first, second, third and fourth states such that when the configurable-interconnect element is in the first state, the value of the first output of the configurable-interconnect element is such that the value of the first output of the first logic gate is determined by the value(s) of the input(s) to the first logic gate other than its first input and the value of the second output of the configurable-interconnect element is such that the value of the first output of the second logic gate is determined by the value(s) of the input(s) to the second logic gate other than its first input, and when the configurable-interconnect element is in the second state, one output of the configurable-interconnect element is equal to the value of the first input of the configurable-interconnect element and the other output is equal to the logical inverse of the value of the first input to the configurable-interconnect element, and when the configurable-interconnect element is in the third state, the value of the first output of the configurable-interconnect element is equal to the value of the first input of the configurable-interconnect element and the value of the second output of the configurable-interconnect element is such that the first output of the second logic gate is determined by the value(s) of the input(s) to the second logic gate other than its first input, and when the configurable-interconnect element is in the fourth state, the value of the first output of the configurable-interconnect element is such that the value of the first output of the first logic gate is determined by the value(s) of the input(s) to the first logic gate other than its first input and the value of the second output of the configurable-interconnect element is such that the first output of the second logic gate provides a constant value output such that the third logic gate performs a logical inversion function from its first input to its first output.

2. The logic circuit of claim 1, wherein when the configurable-interconnect element is in the second state, the logic circuit can implement a multiplexer for connecting the second input of either the first or second gate to the first output of the third gate, depending on the value of the first input to the configurable-interconnect element.

3. The logic circuit of claim 1, further comprising a configuration control means for controlling the state of the configurable-interconnect element.

4. A programmable logic circuit comprising:
first, second and third logic gates, each having at least first and second inputs and at least a first output, said first and second inputs to the third logic gate being connected to the first outputs of the first and second logic gates, respectively;
a configurable-interconnect element having a first input and first and second outputs, said first output being connected to the first input of the first logic gate and said second output being connected to the first input of the second logic gate; and
a register having a data input and a data output, the data input being connected to the first output of the third logic gate.

5. The logic circuit of claim 4, wherein the third logic gate is an exclusive-OR gate.

6. The logic circuit of claim 5, further comprising means for asserting a logical "1" value at an input to the exclusive-OR gate.

7. The logic circuit of claim 6, further comprising means for asserting a logical "0" value at an input to the exclusive-OR gate.

8. The logic circuit of claim 7, wherein the logic circuit can implement a 1-bit slice of a parallel-loadable shift register.

9. The logic circuit of claim 4, further comprising a fourth logic gate having at least first and second inputs and a first output, said first and second inputs being connected to the first outputs of the first and second logic gates, respectively.

10. The logic circuit of claim 9, wherein the logic circuit can implement the logic of a 1-bit slice for a binary counter.

11. The logic circuit of claim 9, further comprising feedback means for connecting the data output of the register to an input of either the first or second logic gate.

12. The logic circuit of claim 11, wherein the logic circuit can implement a register with clock enable.

13. The logic circuit of claim 9, further comprising an inverter having an input and an output, said input being connected to the first output of the fourth logic gate.

14. The logic circuit of claim 9, wherein the first, second and fourth logic gates are AND gates.

15. The logic circuit of claim 9, wherein the first and second logic gates are NAND gates and the fourth logic gate is a NOR gate.

16. A programmable logic cell for use in a programmable logic cell array, said cell comprising:
first, second, and third cell inputs;
at least a first cell output;
first, second and third logic gates, each having at least first and second inputs and at least a first output, said first and second inputs to the third logic gate being connected to the first outputs of the first and second logic gates, respectively;
a configurable-interconnect element having a first input and first and second outputs, said first output being connected to the first input of the first logic gate and said second output being connected to the first input of the second logic gate;
means for connecting the first cell input to the first input of the first logic gate;
means for connecting the second cell input to the first input of the second logic gate;
means for connecting the third cell input to the first input of the configurable-interconnect element; and
means for connecting the output of the third logic gate to the first cell output.

17. In a programmable logic array, said array including a means for supplying K configuration control signals and their logical inverses, a programmable default-output multiplexer responsive to the configuration control signals for connecting one of K input terminals or a default value to an output terminal, said multiplexer comprising:
K pass gates, wherein each pass gate can connect one of the K input terminals to the output terminal when activated by the value of one of the K configuration control signals and its logical inverse, each pass gate comprising an N-type MOS transistor including drain, source, and gate terminals, wherein the drain terminal connects to one of the K input terminals, the source terminal connects to the output terminal, and the gate terminal connects to one of the K configuration control signals, and a P-type MOS transistor including drain, source, and gate terminals, wherein the source terminal connects to one of the K input terminals, the drain terminal connects to the output terminal, and the gate terminal connects to the logical inverse of the configuration control signal; and
a chain of K MOS transistors for supplying a default value to the output terminal when none of the K pass gates is activated, each of the K MOS transistors in the chain including drain, source and gate terminals, wherein the chain is formed by connecting the source terminal of each MOS transistor in the chain to the drain terminal of the next MOS transistor in the chain, one of the source/drain terminals at an end of the chain connects to a means for supplying a default value and the source/drain terminal at the other end of the chain connects to the output terminal of the multiplexer, and the gate voltage of each MOS transistor in the chain is determined by a different one of the K configuration control signals which control the K pass gates whereby all MOS transistors in the chain are conducting only when all the K pass gates are not activated.

18. A multiplexer as defined in claim 17, wherein the MOS transistors in the chain are N-type MOS transistors, the gate terminal of each N-type MOS transistor in the chain connects to the logical inverse of a different one of the K configuration control signals, and the means for supplying a default value supplies a low value.

19. A multiplexer as defined in claim 17, wherein the MOS transistors in the chain are P-type MOS transistors, the gate terminal of each P-type MOS transistor in the chain connects to a different one of the K configuration control signals, and the means for supplying a default value supplies a high value.

20. A programmable logic cell for use in a programmable logic array, said logic cell comprising:
means for supplying a configuration control;
first, second and third cell inputs;
a cell output;
first and second logic gates each having first and second inputs;
a third logic gate having at least two inputs;
means for connecting said first cell input to said first input of said first logic gate;
means for connecting said second cell input to said first input of said second logic gate;
means responsive to the configuration control for connecting either said third cell input or a constant logical value to said second input of said first logic gate;
means responsive to the configuration control for connecting either an inverted form of said third cell input or a constant logical value to said second input of said second logic gate;
means for connecting the output of said first logic gate to an input of said third logic gate;
means for connecting the output of said second logic gate to an input of said third logic gate; and
means for connecting the output of said third logic gate to the cell output.

21. The logic cell of claim 20, wherein said first and second logic gates are either AND or NAND gates and said third logic gate is either an XOR or an XNOR gate.

22. The logic cell of claim 20, wherein the logic cell can be configured to implement a multiplexer.

23. The logic cell of claim 20 further comprising:
a register having a data input and a data output;
means for connecting the output of said third logic gate to said data input of said register; and
means for connecting said data output of said register to the cell output.

24. The logic cell of claim 23, wherein the logic cell can be configured to implement a parallel-loadable shift register.

25. The logic cell of claim 23, wherein the logic cell can be configured to implement the logic for a register with clock enable.

26. The logic cell of claim 23, further comprising:
a fourth logic gate having at least two inputs;
means for connecting the output of said first logic gate to an input of said fourth logic gate;
means for connecting the output of said second logic gate to an input of said fourth logic gate; and
means for connecting the output of said fourth logic gate to a second cell output.

27. The logic cell of claim 26, wherein said fourth logic gate is either an AND gate or a NAND gate.

28. The logic cell of claim 26, wherein the logic cell can be configured to implement the logic for a 1-bit slice of a binary counter.

29. A programmable logic array comprising:
a plurality of logic cells, wherein each cell except those at the edges of the array has four nearest-neighbor cells, one to the left (or West), one to the right (or East), one above (or to the North), and one below (or to the South) so as to form an array in which said logic cells are aligned in rows and columns, each cell comprising:
means for supplying a configuration control;
four "A" inputs, one received from each of the nearest-neighbor cells;
four "B" inputs, one received from each of the four nearest-neighbor cells;
first, second and third logic gates, each having at least first and second inputs and at least a first output, said first and second inputs to the third logic gate being connected to the outputs of the first and second logic gates, respectively;
a configurable-interconnect element having a first input and first and second outputs, said first output being connected to the first input of the first logic gate and said second output being connected to the first input of the second logic gate;
means programmably responsive to the configuration control means for connecting one of the "A" inputs to the second input of the first logic gate;
means programmably responsive to the configuration control means for connecting one of the "B" inputs to the second input of the second logic gate; and
means responsive to the configuration control means for connecting the output of the third logic gate to the "A" inputs and/or the "B" inputs of the four nearest-neighbor cells.

30. The programmable logic array of claim 29, wherein the configurable-interconnect element of each cell further comprises means for generating first and second states such that when the configurable-interconnect element is in the first state, the value of the first output of the configurable-interconnect element is set such that the value of the first output of the first logic gate is determined by the value(s) of the input(s) to the first logic gate other than its first input and the value of the second output of the configurable-interconnect element is such that the value of the first output of the second logic gate is determined by the value(s) of the input(s) to the second logic gate other than its first input, and when the configurable-interconnect element is in the second state, one output of the configurable-interconnect element is equal to the value of the first input of the configurable element and the other output is equal to the logical inverse of the value of the first input to the configurable-interconnect element.

31. The programmable logic array of claim 30, wherein the configurable-interconnect element of each cell further comprises means for generating third and fourth states such that when the configurable-interconnect element is in the third state, the value of the first output of the configurable-interconnect element is equal to the value of the first input to the configurable-interconnect element and the value of the second output of the configurable-interconnect element is such that the first output of the second logic gate is determined by the value(s) of the input(s) to the second logic gate other than its first input, and when the configurable-interconnect element is in the fourth state, the value of the first output of the configurable-interconnect element is such that the value of the first output of the first logic gate is determined by the value(s) of the input(s) to the first logic gate other than its first input and the value of the second output of the configurable-interconnect element is such that the first output of the second logic gate provides a constant value output such that the third logic gate performs a logical inversion function from its first input to its first output.

32. The programmable logic array of claim 30, wherein each cell further comprises a fourth logic gate having at least first and second inputs and at least a first output, said first and second inputs being connected to the first outputs of the first and second logic gates, respectively, and the output of the third logic gate can be provided to the "A" inputs of the four nearest-neighbor cells and the output of the fourth logic gate can be provided to the "B" inputs of the nearest-neighbor cells.

33. A programmable logic array comprising:
a plurality of logic cells, wherein each cell except those at the edges of the array has four nearest-neighbor cells, one to the left (or West), one to the right (or East), one above (or to the North), and one below (or to the South) so as to form an array in which said logic cells are aligned in rows and columns, each cell comprising:
means for supplying a configuration control;
four inputs, one received from each of the nearest-neighbor cells;
first, second and third logic gates, each having at least first and second inputs and at least a first output, said first and second inputs to the third logic gate being connected to the first outputs of the first and second logic gates, respectively;
a configurable-interconnect element having a first input and first and second outputs, said first output being connected to the first input of the first logic gate and said second output being connected to the first input of the second logic gate;
means programmably responsive to the configuration control means for connecting one of the four nearest-neighbor inputs to the second input to the first logic gate;
means programmably responsive to the configuration control means for connecting one of the four nearest-neighbor inputs to the second input to the second logic gate;
North output-selecting means for connecting one of a plurality of candidate North outputs, including the inputs from the South, East, and West nearest-neighbor cells and the output of the third logic gate, to an input of the nearest-neighbor cell to the North;
South output-selecting means for connecting one of a plurality of candidate South outputs, including the inputs from the North, East, and West nearest-neighbor cells and the output of the third logic gate, to an input of the nearest-neighbor cell to the South;
East output-selecting means for connecting one of a plurality of candidate East outputs, including the inputs from the North, South and West nearest-neighbor cells and the output of the third logic gate, to an input of the nearest-neighbor cell to the East; and,
West output-selecting means for connecting one of a plurality of candidate West outputs, including the inputs from the North, South, and East nearest-neighbor cells and the output of the third logic gate, to an input of the nearest-neighbor cell to the West.

34. The programmable logic array of claim 33, wherein the configurable-interconnect element of each cell further comprises means for generating first and second states such that when the configurable-interconnect element is in the first state, the value of the first output of the configurable-interconnect element is set such that the value of the first output of the first logic gate is determined by the value(s) of the input(s) to the first logic gate other than its first input and the value of the second output of the configurable-interconnect element is such that the value of the first output of the second logic gate is determined by the value(s) of the input(s) to the second logic gate other than its first input, and when the configurable-interconnect element is in the second state, one output of the configurable-interconnect element is equal to the value of the first input of the configurable-interconnect element and the other output is equal to the logical inverse of the first input to the configurable-interconnect element.

35. The programmable logic array of claim 34 wherein each cell further comprises a fourth logic gate having at least first and second inputs and an output, the first and second inputs being connected to the first outputs of the first and second logic gates and the output of the fourth logic gate being provided to each one of the North, South, East and West output-selecting means as one of the plurality of candidate outputs from each such selecting means.

* * * * *